(12) United States Patent
Schofield et al.

(10) Patent No.: US 8,379,289 B2
(45) Date of Patent: *Feb. 19, 2013

(54) REARVIEW MIRROR ASSEMBLY FOR VEHICLE

(75) Inventors: Kenneth Schofield, Holland, MI (US); David C. Wight, Goodrich, MI (US); Mark E. Kramer, Zeeland, MI (US)

(73) Assignee: Donnelly Corporation, Holland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/470,864

(22) Filed: May 14, 2012

(65) Prior Publication Data

US 2012/0224248 A1    Sep. 6, 2012

Related U.S. Application Data

(63) Continuation of application No. 13/033,951, filed on Feb. 24, 2011, now Pat. No. 8,179,586, which is a continuation of application No. 12/580,499, filed on Oct. 16, 2009, now Pat. No. 7,898,719, which is a continuation of application No. 12/260,499, filed on (Continued)

(51) Int. Cl.
*G02F 1/157*    (2006.01)
(52) U.S. Cl. ........................................... 359/267
(58) Field of Classification Search .................. None
See application file for complete search history.

(56) References Cited

U.S. PATENT DOCUMENTS

| | | |
|---|---|---|
| 1,096,452 A | 5/1914 | Perrin |
| 1,563,258 A | 11/1925 | Cunningham |
| 2,069,368 A | 2/1937 | Horinstein |
| 2,166,303 A | 7/1939 | Hodny et al. |
| 2,263,382 A | 11/1941 | Gotzinger |
| 2,414,223 A | 1/1947 | DeVirgilis |
| 2,457,348 A | 12/1948 | Chambers |
| 2,561,582 A | 7/1951 | Marbel |

(Continued)

FOREIGN PATENT DOCUMENTS

| | | |
|---|---|---|
| AU | A-40317/95 | 2/1995 |
| CN | 1189224 | 7/1998 |

(Continued)

OTHER PUBLICATIONS

Stewart, James W.; HP SnapLED: LED Assemblies for AutomotiVe Signal Applications; Nov. 1, 1998; Hewlett-Packard Journal; vol. 50, No. 1, www.hpl.hp.com/hpjournal/98nov/nov98al.pdf.
Edgar, Julian; Goodbye 12 Volts . . . Hello 42 Volts!; Oct. 5, 1999; Autospeed 50; Issue 50; www.autospeed.co.nz/cms/A_0319/article.html.

(Continued)

*Primary Examiner* — Derek S Chapel
(74) *Attorney, Agent, or Firm* — Gardner, Linn, Burkhart & Flory, LLP

(57) ABSTRACT

An electrochromic interior reflective element for an interior rearview mirror assembly of a vehicle includes front and rear substrates and an electrochromic medium sandwiched between the front and rear substrates. The electrochromic medium is disposed in an interpane cavity established between a third surface of the rear substrate and a second surface of said the substrate, and the electrochromic medium is bounded by a perimeter seal. A conductive layer is disposed at a fourth surface of the rear substrate. A non-conductive layer covers a covered portion of the conductive layer and leaves an exposed portion of the conductive layer exposed. An electronic circuitry component is disposed at the fourth surface of the rear substrate. The electronic circuitry component is electrically connected to the exposed portion of the conductive layer.

22 Claims, 4 Drawing Sheets

Related U.S. Application Data

Oct. 29, 2008, now abandoned, which is a continuation of application No. 10/956,749, filed on Oct. 1, 2004, now Pat. No. 7,446,924.

(60) Provisional application No. 60/508,086, filed on Oct. 2, 2003.

(56) References Cited

U.S. PATENT DOCUMENTS

| | | |
|---|---|---|
| 2,580,014 A | 12/1951 | Gazda |
| 3,004,473 A | 10/1961 | Arthur et al. |
| 3,075,430 A | 1/1963 | Woodward et al. |
| 3,141,393 A | 7/1964 | Platt |
| 3,152,216 A | 10/1964 | Woodward |
| 3,162,008 A | 12/1964 | Berger et al. |
| 3,185,020 A | 5/1965 | Thelen |
| 3,266,016 A | 8/1966 | Maruyama et al. |
| 3,280,701 A | 10/1966 | Donnelly et al. |
| 3,432,225 A | 3/1969 | Rock |
| 3,451,741 A | 6/1969 | Manos |
| 3,453,038 A | 7/1969 | Kissa et al. |
| 3,467,465 A | 9/1969 | Van Noord |
| 3,473,867 A | 10/1969 | Byrnes |
| 3,480,781 A | 11/1969 | Mandalakas |
| 3,499,112 A | 3/1970 | Heilmeier et al. |
| 3,499,702 A | 3/1970 | Goldmacher et al. |
| 3,521,941 A | 7/1970 | Deb et al. |
| 3,543,018 A | 11/1970 | Barcus et al. |
| 3,557,265 A | 1/1971 | Chisholm et al. |
| 3,565,985 A | 2/1971 | Schrenk et al. |
| 3,612,654 A | 10/1971 | Klein |
| 3,614,210 A | 10/1971 | Caplan |
| 3,628,851 A | 12/1971 | Robertson |
| 3,676,668 A | 7/1972 | Collins et al. |
| 3,680,951 A | 8/1972 | Jordan et al. |
| 3,689,695 A | 9/1972 | Rosenfield et al. |
| 3,711,176 A | 1/1973 | Alfrey, Jr. et al. |
| 3,712,710 A | 1/1973 | Castellion et al. |
| 3,748,017 A | 7/1973 | Yamamura et al. |
| 3,781,090 A | 12/1973 | Sumita |
| 3,806,229 A | 4/1974 | Schoot et al. |
| 3,807,832 A | 4/1974 | Castellion |
| 3,807,833 A | 4/1974 | Graham et al. |
| 3,821,590 A | 6/1974 | Kosman et al. |
| 3,837,129 A | 9/1974 | Losell |
| 3,860,847 A | 1/1975 | Carley |
| 3,862,798 A | 1/1975 | Hopkins |
| 3,870,404 A | 3/1975 | Wilson et al. |
| 3,876,287 A | 4/1975 | Sprokel |
| 3,932,024 A | 1/1976 | Yaguchi et al. |
| 3,940,822 A | 3/1976 | Emerick et al. |
| 3,956,017 A | 5/1976 | Shigemasa |
| 3,978,190 A | 8/1976 | Kurz, Jr. et al. |
| 3,985,424 A | 10/1976 | Steinacher |
| 4,006,546 A | 2/1977 | Anderson et al. |
| 4,035,681 A | 7/1977 | Savage |
| 4,040,727 A | 8/1977 | Ketchpel |
| 4,052,712 A | 10/1977 | Ohama et al. |
| 4,075,468 A | 2/1978 | Marcus |
| 4,088,400 A | 5/1978 | Assouline et al. |
| 4,093,364 A | 6/1978 | Miller |
| 4,097,131 A | 6/1978 | Nishiyama |
| 4,109,235 A | 8/1978 | Bouthors |
| 4,139,234 A | 2/1979 | Morgan |
| 4,159,866 A | 7/1979 | Wunsch et al. |
| 4,161,653 A | 7/1979 | Bedini et al. |
| 4,171,875 A | 10/1979 | Taylor et al. |
| 4,174,152 A | 11/1979 | Gilia et al. |
| 4,200,361 A | 4/1980 | Malvano et al. |
| 4,202,607 A | 5/1980 | Washizuka et al. |
| 4,211,955 A | 7/1980 | Ray |
| 4,214,266 A | 7/1980 | Myers |
| 4,219,760 A | 8/1980 | Ferro |
| 4,221,955 A | 9/1980 | Joslyn |
| 4,228,490 A | 10/1980 | Thillays |
| 4,247,870 A | 1/1981 | Gabel et al. |
| 4,257,703 A | 3/1981 | Goodrich |
| 4,274,078 A | 6/1981 | Isobe et al. |
| 4,277,804 A | 7/1981 | Robison |
| 4,281,899 A | 8/1981 | Oskam |
| 4,288,814 A | 9/1981 | Talley et al. |
| RE30,835 E | 12/1981 | Giglia |
| 4,306,768 A | 12/1981 | Egging |
| 4,310,851 A | 1/1982 | Pierrat |
| 4,331,382 A | 5/1982 | Graff |
| 4,338,000 A | 7/1982 | Kamimori et al. |
| 4,377,613 A | 3/1983 | Gordon |
| 4,398,805 A | 8/1983 | Cole |
| 4,419,386 A | 12/1983 | Gordon |
| 4,420,238 A | 12/1983 | Felix |
| 4,425,717 A | 1/1984 | Marcus |
| 4,435,042 A | 3/1984 | Wood et al. |
| 4,435,048 A | 3/1984 | Kamimori et al. |
| 4,436,371 A | 3/1984 | Wood et al. |
| 4,438,348 A | 3/1984 | Casper et al. |
| 4,443,057 A | 4/1984 | Bauer et al. |
| 4,446,171 A | 5/1984 | Thomas |
| 4,465,339 A | 8/1984 | Baucke et al. |
| 4,473,695 A | 9/1984 | Wrighton et al. |
| 4,490,227 A | 12/1984 | Bitter |
| 4,491,390 A | 1/1985 | Tong-Shen |
| 4,499,451 A | 2/1985 | Suzuki et al. |
| 4,521,079 A | 6/1985 | Leenhouts et al. |
| 4,524,941 A | 6/1985 | Wood et al. |
| 4,538,063 A | 8/1985 | Bulat |
| 4,546,551 A | 10/1985 | Franks |
| 4,555,694 A | 11/1985 | Yanagishima et al. |
| 4,561,625 A | 12/1985 | Weaver |
| 4,572,619 A | 2/1986 | Reininger et al. |
| 4,580,196 A | 4/1986 | Task |
| 4,580,875 A | 4/1986 | Bechtel et al. |
| 4,581,827 A | 4/1986 | Higashi |
| 4,588,267 A | 5/1986 | Pastore |
| 4,603,946 A | 8/1986 | Kato et al. |
| 4,623,222 A | 11/1986 | Itoh et al. |
| 4,625,210 A | 11/1986 | Sagl |
| 4,626,850 A | 12/1986 | Chey |
| 4,630,040 A | 12/1986 | Haertling |
| 4,630,109 A | 12/1986 | Barton |
| 4,630,904 A | 12/1986 | Pastore |
| 4,634,835 A | 1/1987 | Suzuki |
| 4,635,033 A | 1/1987 | Inukai et al. |
| 4,636,782 A | 1/1987 | Nakamura et al. |
| 4,638,287 A | 1/1987 | Umebayashi et al. |
| 4,646,210 A | 2/1987 | Skogler et al. |
| 4,652,090 A | 3/1987 | Uchikawa et al. |
| 4,655,549 A | 4/1987 | Suzuki et al. |
| 4,664,479 A | 5/1987 | Hiroshi |
| 4,665,311 A | 5/1987 | Cole |
| 4,665,430 A | 5/1987 | Hiroyasu |
| 4,669,827 A | 6/1987 | Fukada et al. |
| 4,671,615 A | 6/1987 | Fukada et al. |
| 4,671,619 A | 6/1987 | Kamimori et al. |
| 4,678,281 A | 7/1987 | Bauer |
| 4,679,906 A | 7/1987 | Brandenburg |
| 4,682,083 A | 7/1987 | Alley |
| 4,692,798 A | 9/1987 | Seko et al. |
| 4,694,295 A | 9/1987 | Miller et al. |
| 4,697,883 A | 10/1987 | Suzuki et al. |
| 4,701,022 A | 10/1987 | Jacob |
| 4,702,566 A | 10/1987 | Tukude et al. |
| 4,704,740 A | 11/1987 | McKee et al. |
| 4,711,544 A | 12/1987 | Iino et al. |
| 4,712,879 A | 12/1987 | Lynam et al. |
| 4,713,685 A | 12/1987 | Nishimura et al. |
| RE32,576 E | 1/1988 | Pastore |
| 4,718,756 A | 1/1988 | Lancaster |
| 4,721,364 A | 1/1988 | Itoh et al. |
| 4,729,068 A | 3/1988 | Ohe |
| 4,729,076 A | 3/1988 | Masami et al. |
| 4,731,669 A | 3/1988 | Hayashi et al. |
| 4,733,335 A | 3/1988 | Serizawa et al. |
| 4,733,336 A | 3/1988 | Skogler et al. |
| 4,740,838 A | 4/1988 | Mase et al. |

| | | | | | | |
|---|---|---|---|---|---|---|
| 4,761,061 A | 8/1988 | Nishiyama et al. | | 5,052,163 A | 10/1991 | Czekala |
| 4,773,740 A | 9/1988 | Kawakami et al. | | 5,056,899 A | 10/1991 | Warszawski |
| 4,780,752 A | 10/1988 | Angerstein et al. | | 5,057,974 A | 10/1991 | Mizobe |
| 4,781,436 A | 11/1988 | Armbruster | | 5,058,851 A | 10/1991 | Lawlor et al. |
| 4,789,774 A | 12/1988 | Koch et al. | | 5,059,015 A | 10/1991 | Tran |
| 4,789,904 A | 12/1988 | Peterson | | 5,066,108 A | 11/1991 | McDonald |
| 4,793,690 A | 12/1988 | Gahan et al. | | 5,066,112 A | 11/1991 | Lynam et al. |
| 4,793,695 A | 12/1988 | Wada et al. | | 5,069,535 A | 12/1991 | Baucke et al. |
| 4,794,261 A | 12/1988 | Rosen | | 5,070,323 A | 12/1991 | Iino et al. |
| D299,491 S | 1/1989 | Masuda | | 5,073,012 A | 12/1991 | Lynam |
| 4,799,768 A | 1/1989 | Gahan | | 5,076,673 A | 12/1991 | Lynam et al. |
| 4,803,599 A | 2/1989 | Trine et al. | | 5,076,674 A | 12/1991 | Lynam |
| 4,807,096 A | 2/1989 | Skogler et al. | | 5,078,480 A | 1/1992 | Warszawski |
| 4,820,933 A | 4/1989 | Hong et al. | | 5,096,287 A | 3/1992 | Kakinami et al. |
| 4,825,232 A | 4/1989 | Howdle | | 5,100,095 A | 3/1992 | Haan et al. |
| 4,826,289 A | 5/1989 | Vandenbrink et al. | | 5,101,139 A | 3/1992 | Lechter |
| 4,827,086 A | 5/1989 | Rockwell | | 5,105,127 A | 4/1992 | Lavaud et al. |
| 4,837,551 A | 6/1989 | Iino | | 5,115,346 A | 5/1992 | Lynam |
| 4,842,378 A | 6/1989 | Flasck et al. | | 5,119,220 A | 6/1992 | Narita et al. |
| 4,845,402 A | 7/1989 | Smith | | 5,121,200 A | 6/1992 | Choi |
| 4,847,772 A | 7/1989 | Michalopoulos et al. | | 5,122,619 A | 6/1992 | Dlubak |
| 4,855,161 A | 8/1989 | Moser et al. | | 5,123,077 A | 6/1992 | Endo et al. |
| 4,855,550 A | 8/1989 | Schultz, Jr. | | 5,124,845 A | 6/1992 | Shimojo |
| 4,859,813 A | 8/1989 | Rockwell | | 5,124,890 A | 6/1992 | Choi et al. |
| 4,859,867 A | 8/1989 | Larson et al. | | 5,128,799 A | 7/1992 | Byker |
| 4,860,171 A | 8/1989 | Kojima | | 5,130,898 A | 7/1992 | Akahane |
| 4,862,594 A | 9/1989 | Schierbeek et al. | | 5,131,154 A | 7/1992 | Schierbeek et al. |
| 4,871,917 A | 10/1989 | O'Farrell et al. | | 5,134,507 A | 7/1992 | Ishii |
| 4,872,051 A | 10/1989 | Dye | | 5,134,549 A | 7/1992 | Yokoyama |
| 4,882,466 A | 11/1989 | Friel | | 5,135,298 A | 8/1992 | Feltman |
| 4,882,565 A | 11/1989 | Gallmeyer | | 5,136,483 A | 8/1992 | Schöniger et al. |
| 4,883,349 A | 11/1989 | Mittelhäuser | | 5,140,455 A | 8/1992 | Varaprasad et al. |
| 4,884,135 A | 11/1989 | Schiffman | | 5,140,465 A | 8/1992 | Yasui et al. |
| 4,886,960 A | 12/1989 | Molyneux et al. | | 5,142,407 A | 8/1992 | Varaprasad et al. |
| 4,889,412 A | 12/1989 | Clerc et al. | | 5,145,609 A | 9/1992 | Varaprasad et al. |
| 4,891,828 A | 1/1990 | Kawazoe | | 5,148,306 A | 9/1992 | Yamada et al. |
| 4,892,345 A | 1/1990 | Rachael, III | | 5,150,232 A | 9/1992 | Gunkima et al. |
| 4,902,103 A | 2/1990 | Miyake et al. | | 5,151,816 A | 9/1992 | Varaprasad et al. |
| 4,902,108 A | 2/1990 | Byker | | 5,151,824 A | 9/1992 | O'Farrell |
| 4,906,085 A | 3/1990 | Sugihara et al. | | 5,154,617 A | 10/1992 | Suman et al. |
| 4,909,606 A | 3/1990 | Wada et al. | | 5,158,638 A | 10/1992 | Osanami et al. |
| 4,910,591 A | 3/1990 | Petrossian et al. | | 5,160,200 A | 11/1992 | Cheselske |
| 4,916,374 A | 4/1990 | Schierbeek et al. | | 5,160,201 A | 11/1992 | Wrobel |
| 4,917,477 A | 4/1990 | Bechtel et al. | | 5,166,815 A | 11/1992 | Elderfield |
| 4,926,170 A | 5/1990 | Beggs et al. | | 5,168,378 A | 12/1992 | Black et al. |
| 4,930,742 A | 6/1990 | Schofield et al. | | 5,173,881 A | 12/1992 | Sindle |
| 4,933,814 A | 6/1990 | Sanai | | 5,177,031 A | 1/1993 | Buchmann et al. |
| 4,935,665 A | 6/1990 | Murata | | 5,178,448 A | 1/1993 | Adams et al. |
| 4,936,533 A | 6/1990 | Adams et al. | | 5,179,471 A | 1/1993 | Caskey et al. |
| 4,937,796 A | 6/1990 | Tendler | | 5,183,099 A | 2/1993 | Bechu |
| 4,937,945 A | 7/1990 | Schofield et al. | | 5,184,956 A | 2/1993 | Langlarais et al. |
| 4,943,796 A | 7/1990 | Lee | | 5,189,537 A | 2/1993 | O'Farrell |
| 4,948,242 A | 8/1990 | Desmond et al. | | 5,193,029 A | 3/1993 | Schofield et al. |
| 4,953,305 A | 9/1990 | Van Lente et al. | | 5,197,562 A | 3/1993 | Kakinama et al. |
| 4,956,591 A | 9/1990 | Schierbeek et al. | | 5,202,950 A | 4/1993 | Arego et al. |
| 4,957,349 A | 9/1990 | Clerc et al. | | 5,207,492 A | 5/1993 | Roberts |
| 4,959,247 A | 9/1990 | Moser et al. | | 5,210,967 A | 5/1993 | Brown |
| 4,959,865 A | 9/1990 | Stettiner et al. | | 5,212,819 A | 5/1993 | Wada |
| 4,970,653 A | 11/1990 | Kenue | | 5,214,408 A | 5/1993 | Asayama |
| 4,973,844 A | 11/1990 | O'Farrell et al. | | 5,217,794 A | 6/1993 | Schrenk |
| 4,974,122 A | 11/1990 | Shaw | | 5,223,814 A | 6/1993 | Suman |
| 4,978,196 A | 12/1990 | Suzuki et al. | | 5,223,844 A | 6/1993 | Mansell et al. |
| 4,983,951 A | 1/1991 | Igarashi et al. | | 5,229,975 A | 7/1993 | Truesdell et al. |
| 4,985,809 A | 1/1991 | Matsui et al. | | 5,230,400 A | 7/1993 | Kakinami et al. |
| 4,987,357 A | 1/1991 | Masaki | | 5,233,461 A | 8/1993 | Dornan et al. |
| 4,989,956 A | 2/1991 | Wu et al. | | 5,235,316 A | 8/1993 | Qualizza |
| 4,996,083 A | 2/1991 | Moser et al. | | 5,239,405 A | 8/1993 | Varaprasad et al. |
| 5,001,386 A | 3/1991 | Sullivan et al. | | 5,239,406 A | 8/1993 | Lynam |
| 5,001,558 A | 3/1991 | Burley et al. | | 5,243,417 A | 9/1993 | Pollard |
| 5,005,213 A | 4/1991 | Hanson et al. | | 5,245,422 A | 9/1993 | Borcherts et al. |
| 5,006,971 A | 4/1991 | Jenkins | | 5,252,354 A | 10/1993 | Cronin et al. |
| 5,014,167 A | 5/1991 | Roberts | | 5,253,109 A | 10/1993 | O'Farrell et al. |
| 5,016,988 A | 5/1991 | Iimura | | 5,255,442 A | 10/1993 | Schierbeek et al. |
| 5,016,996 A | 5/1991 | Ueno | | 5,260,626 A | 11/1993 | Takase et al. |
| 5,017,903 A | 5/1991 | Krippelz, Sr. | | 5,277,986 A | 1/1994 | Cronin et al. |
| 5,018,839 A | 5/1991 | Yamamoto et al. | | 5,280,555 A | 1/1994 | Ainsburg |
| 5,027,200 A | 6/1991 | Petrossian et al. | | 5,285,060 A | 2/1994 | Larson et al. |
| 5,037,182 A | 8/1991 | Groves et al. | | 5,289,321 A | 2/1994 | Secor |
| 5,038,255 A | 8/1991 | Nashihashi et al. | | 5,296,924 A | 3/1994 | de Saint Blancard et al. |

| | | | | | |
|---|---|---|---|---|---|
| 5,303,075 A | 4/1994 | Wada et al. | 5,528,422 A | 6/1996 | Roberts |
| 5,303,205 A | 4/1994 | Gauthier et al. | 5,528,474 A | 6/1996 | Roney et al. |
| 5,304,980 A | 4/1994 | Maekawa | 5,529,138 A | 6/1996 | Shaw et al. |
| 5,305,012 A | 4/1994 | Faris | 5,530,240 A | 6/1996 | Larson et al. |
| 5,307,136 A | 4/1994 | Saneyoshi | 5,530,420 A | 6/1996 | Tsuchiya et al. |
| 5,313,335 A | 5/1994 | Gray et al. | 5,530,421 A | 6/1996 | Marshall et al. |
| 5,325,096 A | 6/1994 | Pakett | 5,535,056 A | 7/1996 | Caskey et al. |
| 5,325,386 A | 6/1994 | Jewell et al. | 5,535,144 A | 7/1996 | Kise |
| 5,327,288 A | 7/1994 | Wellington et al. | 5,539,397 A | 7/1996 | Asanuma et al. |
| 5,330,149 A | 7/1994 | Haan et al. | 5,541,590 A | 7/1996 | Nishio |
| 5,331,312 A | 7/1994 | Kudoh | 5,550,677 A | 8/1996 | Schofield et al. |
| 5,331,358 A | 7/1994 | Schurle et al. | 5,555,172 A | 9/1996 | Potter |
| 5,339,075 A | 8/1994 | Abst et al. | 5,561,333 A | 10/1996 | Darius |
| 5,339,529 A | 8/1994 | Lindberg | 5,566,224 A | 10/1996 | ul Azam et al. |
| 5,341,437 A | 8/1994 | Nakayama | 5,567,360 A | 10/1996 | Varaprasad et al. |
| D351,370 S | 10/1994 | Lawlor et al. | 5,568,316 A | 10/1996 | Schrenck et al. |
| 5,354,965 A | 10/1994 | Lee | 5,570,127 A | 10/1996 | Schmidt |
| 5,355,118 A | 10/1994 | Fukuhara | 5,572,354 A | 11/1996 | Desmond et al. |
| 5,355,245 A | 10/1994 | Lynam | 5,574,426 A | 11/1996 | Shisgal et al. |
| 5,355,284 A | 10/1994 | Roberts | 5,574,443 A | 11/1996 | Hsleh |
| 5,361,190 A | 11/1994 | Roberts et al. | 5,575,552 A | 11/1996 | Faloon et al. |
| 5,363,294 A | 11/1994 | Yamamoto et al. | 5,576,687 A | 11/1996 | Blank et al. |
| 5,371,659 A | 12/1994 | Pastrick et al. | 5,576,854 A | 11/1996 | Schmidt et al. |
| 5,373,482 A | 12/1994 | Gauthier | 5,576,975 A | 11/1996 | Sasaki et al. |
| 5,379,146 A | 1/1995 | Defendini | 5,578,404 A | 11/1996 | Kliem |
| 5,386,285 A | 1/1995 | Asayama | 5,587,236 A | 12/1996 | Agrawal et al. |
| 5,386,306 A | 1/1995 | Gunjima et al. | 5,587,699 A | 12/1996 | Faloon et al. |
| 5,400,158 A | 3/1995 | Ohnishi et al. | 5,593,221 A | 1/1997 | Evanicky et al. |
| 5,402,103 A | 3/1995 | Tashiro | 5,594,222 A | 1/1997 | Caldwell |
| 5,406,395 A | 4/1995 | Wilson et al. | 5,594,560 A | 1/1997 | Jelley et al. |
| 5,406,414 A | 4/1995 | O'Farrell et al. | 5,594,615 A | 1/1997 | Spijkerman et al. |
| 5,408,353 A | 4/1995 | Nichols et al. | 5,602,542 A | 2/1997 | Widmann et al. |
| 5,408,357 A | 4/1995 | Beukema | 5,602,670 A | 2/1997 | Keegan |
| 5,410,346 A | 4/1995 | Saneyoshi et al. | 5,603,104 A | 2/1997 | Phelps, III et al. |
| 5,414,439 A | 5/1995 | Groves et al. | 5,608,550 A | 3/1997 | Epstein et al. |
| 5,414,461 A | 5/1995 | Kishi et al. | 5,609,652 A | 3/1997 | Yamada et al. |
| 5,416,313 A | 5/1995 | Larson et al. | 5,610,380 A | 3/1997 | Nicolaisen |
| 5,416,478 A | 5/1995 | Morinaga | 5,610,756 A | 3/1997 | Lynam et al. |
| 5,418,610 A | 5/1995 | Fischer | 5,611,966 A | 3/1997 | Varaprasad et al. |
| 5,422,756 A | 6/1995 | Weber | 5,614,885 A | 3/1997 | Van Lente et al. |
| 5,424,726 A | 6/1995 | Beymer | 5,615,023 A | 3/1997 | Yang |
| 5,424,865 A | 6/1995 | Lynam | 5,615,857 A | 4/1997 | Hook |
| 5,424,952 A | 6/1995 | Asayama | 5,617,085 A | 4/1997 | Tsutsumi et al. |
| 5,426,524 A | 6/1995 | Wada et al. | 5,619,374 A | 4/1997 | Roberts |
| 5,430,431 A | 7/1995 | Nelson | 5,619,375 A | 4/1997 | Roberts |
| 5,432,496 A | 7/1995 | Lin | 5,621,571 A | 4/1997 | Bantli et al. |
| 5,432,626 A | 7/1995 | Sasuga et al. | 5,626,800 A | 5/1997 | Williams et al. |
| 5,436,741 A | 7/1995 | Crandall | 5,631,089 A | 5/1997 | Center, Jr. et al. |
| 5,437,931 A | 8/1995 | Tsai et al. | 5,631,638 A | 5/1997 | Kaspar et al. |
| 5,439,305 A | 8/1995 | Santo | 5,631,639 A | 5/1997 | Hibino et al. |
| 5,444,478 A | 8/1995 | Lelong et al. | 5,632,092 A | 5/1997 | Blank et al. |
| 5,446,576 A | 8/1995 | Lynam et al. | 5,632,551 A | 5/1997 | Roney et al. |
| 5,455,716 A | 10/1995 | Suman et al. | 5,634,709 A | 6/1997 | Iwama |
| 5,461,361 A | 10/1995 | Moore | 5,640,216 A | 6/1997 | Hasegawa et al. |
| D363,920 S | 11/1995 | Roberts et al. | 5,642,238 A | 6/1997 | Sala |
| 5,469,187 A | 11/1995 | Yaniv | 5,644,851 A | 7/1997 | Blank et al. |
| 5,469,298 A | 11/1995 | Suman et al. | 5,646,614 A | 7/1997 | Abersfelder et al. |
| 5,475,366 A | 12/1995 | Van Lente et al. | 5,649,756 A | 7/1997 | Adams et al. |
| 5,475,494 A | 12/1995 | Nishida et al. | 5,649,758 A | 7/1997 | Dion |
| 5,481,409 A | 1/1996 | Roberts | 5,650,765 A | 7/1997 | Park |
| 5,483,453 A | 1/1996 | Uemura et al. | 5,650,929 A | 7/1997 | Potter et al. |
| 5,485,161 A | 1/1996 | Vaughn | 5,661,455 A | 8/1997 | Van Lente et al. |
| 5,485,378 A | 1/1996 | Franke et al. | 5,661,651 A | 8/1997 | Geschke et al. |
| 5,487,522 A | 1/1996 | Hook | 5,661,804 A | 8/1997 | Dykema et al. |
| 5,488,496 A | 1/1996 | Pine | 5,662,375 A | 9/1997 | Adams et al. |
| 5,497,305 A | 3/1996 | Pastrick et al. | 5,666,157 A | 9/1997 | Aviv |
| 5,497,306 A | 3/1996 | Pastrick | 5,667,289 A | 9/1997 | Akahane et al. |
| 5,500,760 A | 3/1996 | Varaprasad et al. | 5,668,663 A | 9/1997 | Varaprasad et al. |
| 5,506,701 A | 4/1996 | Ichikawa | 5,668,675 A | 9/1997 | Fredricks |
| 5,509,606 A | 4/1996 | Breithaupt et al. | 5,669,698 A | 9/1997 | Veldman et al. |
| 5,510,983 A | 4/1996 | Iino | 5,669,699 A | 9/1997 | Pastrick et al. |
| 5,515,448 A | 5/1996 | Nishitani | 5,669,704 A | 9/1997 | Pastrick |
| 5,519,621 A | 5/1996 | Worthman | 5,669,705 A | 9/1997 | Pastrick et al. |
| 5,521,744 A | 5/1996 | Mazurek | 5,670,935 A | 9/1997 | Schofield et al. |
| 5,521,760 A | 5/1996 | DeYoung et al. | 5,671,996 A | 9/1997 | Bos et al. |
| 5,523,811 A | 6/1996 | Wada et al. | 5,673,994 A | 10/1997 | Fant, Jr. et al. |
| 5,523,877 A | 6/1996 | Lynam | 5,673,999 A | 10/1997 | Koenck |
| 5,525,264 A | 6/1996 | Cronin et al. | 5,677,598 A | 10/1997 | De Hair et al. |
| 5,525,977 A | 6/1996 | Suman | 5,679,283 A | 10/1997 | Tonar et al. |

| | | | | | |
|---|---|---|---|---|---|
| 5,680,123 A | 10/1997 | Lee | 5,835,166 A | 11/1998 | Hall et al. |
| 5,680,245 A | 10/1997 | Lynam | 5,837,994 A | 11/1998 | Stam et al. |
| 5,680,263 A | 10/1997 | Zimmermann et al. | 5,844,505 A | 12/1998 | Van Ryzin |
| 5,686,975 A | 11/1997 | Lipton | 5,848,373 A | 12/1998 | DeLorme et al. |
| 5,686,979 A | 11/1997 | Weber et al. | 5,850,176 A | 12/1998 | Kinoshita et al. |
| 5,689,241 A | 11/1997 | Clarke, Sr. et al. | 5,850,205 A | 12/1998 | Blouin |
| 5,689,370 A | 11/1997 | Tonar et al. | 5,863,116 A | 1/1999 | Pastrick et al. |
| 5,691,848 A | 11/1997 | Van Lente et al. | 5,864,419 A | 1/1999 | Lynam |
| 5,692,819 A | 12/1997 | Mitsutake et al. | 5,867,801 A | 2/1999 | Denny |
| 5,696,529 A | 12/1997 | Evanicky et al. | 5,871,275 A | 2/1999 | O'Farrell et al. |
| 5,696,567 A | 12/1997 | Wada et al. | 5,871,843 A | 2/1999 | Yoneda et al. |
| 5,699,044 A | 12/1997 | Van Lente et al. | 5,877,707 A | 3/1999 | Kowalick |
| 5,699,188 A | 12/1997 | Gilbert et al. | 5,877,897 A | 3/1999 | Schofield et al. |
| 5,703,568 A | 12/1997 | Hegyi | 5,878,353 A | 3/1999 | ul Azam et al. |
| 5,708,410 A | 1/1998 | Blank et al. | 5,878,370 A | 3/1999 | Olson |
| 5,708,415 A | 1/1998 | Van Lente et al. | 5,879,074 A | 3/1999 | Pastrick |
| 5,708,857 A | 1/1998 | Ishibashi | 5,883,605 A | 3/1999 | Knapp |
| 5,715,093 A | 2/1998 | Schierbeek et al. | 5,883,739 A | 3/1999 | Ashihara et al. |
| 5,724,187 A | 3/1998 | Varaprasad et al. | 5,888,431 A | 3/1999 | Tonar et al. |
| 5,724,316 A | 3/1998 | Brunts | 5,894,196 A | 4/1999 | McDermott |
| 5,729,194 A | 3/1998 | Spears et al. | D409,540 S | 5/1999 | Muth |
| 5,737,226 A | 4/1998 | Olson et al. | 5,899,551 A | 5/1999 | Neijzen et al. |
| 5,741,966 A | 4/1998 | Handfield et al. | 5,899,956 A | 5/1999 | Chan |
| 5,744,227 A | 4/1998 | Bright et al. | 5,904,729 A | 5/1999 | Ruzicka |
| 5,745,050 A | 4/1998 | Nakagawa | 5,910,854 A | 6/1999 | Varaprasad et al. |
| 5,745,266 A | 4/1998 | Smith | 5,914,815 A | 6/1999 | Bos |
| 5,748,172 A | 5/1998 | Song et al. | 5,917,664 A | 6/1999 | O'Neill et al. |
| 5,748,287 A | 5/1998 | Takahashi et al. | 5,918,180 A | 6/1999 | Dimino |
| 5,751,211 A | 5/1998 | Shirai et al. | 5,922,176 A | 7/1999 | Caskey |
| 5,751,246 A | 5/1998 | Hertel | 5,923,027 A | 7/1999 | Stam et al. |
| 5,751,390 A | 5/1998 | Crawford et al. | 5,923,457 A | 7/1999 | Byker et al. |
| 5,751,489 A | 5/1998 | Caskey et al. | 5,924,212 A | 7/1999 | Domanski |
| 5,754,099 A | 5/1998 | Nishimura et al. | 5,926,087 A | 7/1999 | Busch et al. |
| D394,833 S | 6/1998 | Muth | 5,927,792 A | 7/1999 | Welling et al. |
| 5,760,828 A | 6/1998 | Cortes | 5,928,572 A | 7/1999 | Tonar et al. |
| 5,760,931 A | 6/1998 | Saburi et al. | 5,929,786 A | 7/1999 | Schofield et al. |
| 5,760,962 A | 6/1998 | Schofield et al. | 5,935,702 A | 8/1999 | Macquart et al. |
| 5,761,094 A | 6/1998 | Olson et al. | 5,936,774 A | 8/1999 | Street |
| 5,762,823 A | 6/1998 | Hikmet | 5,938,320 A | 8/1999 | Crandall |
| 5,764,139 A | 6/1998 | Nojima et al. | 5,938,321 A | 8/1999 | Bos et al. |
| 5,765,940 A | 6/1998 | Levy et al. | 5,938,721 A | 8/1999 | Dussell et al. |
| 5,767,793 A | 6/1998 | Agravante et al. | 5,940,011 A | 8/1999 | Agravante et al. |
| 5,768,020 A | 6/1998 | Nagao | 5,940,120 A | 8/1999 | Frankhouse et al. |
| 5,775,762 A | 7/1998 | Vitito | 5,940,201 A | 8/1999 | Ash et al. |
| 5,777,779 A | 7/1998 | Hashimoto et al. | 5,942,895 A | 8/1999 | Popovic et al. |
| 5,780,160 A | 7/1998 | Allemand et al. | 5,947,586 A | 9/1999 | Weber |
| 5,786,772 A | 7/1998 | Schofield et al. | 5,949,331 A | 9/1999 | Schofield et al. |
| 5,788,357 A | 8/1998 | Muth et al. | 5,949,506 A | 9/1999 | Jones et al. |
| 5,790,298 A | 8/1998 | Tonar | 5,956,079 A | 9/1999 | Ridgley |
| 5,790,502 A | 8/1998 | Horinouchi et al. | 5,956,181 A | 9/1999 | Lin |
| 5,790,973 A | 8/1998 | Blaker et al. | 5,959,367 A | 9/1999 | O'Farrell et al. |
| 5,793,308 A | 8/1998 | Rosinski et al. | 5,959,555 A | 9/1999 | Furuta |
| 5,793,420 A | 8/1998 | Schmidt | 5,959,577 A | 9/1999 | Fan et al. |
| 5,796,094 A | 8/1998 | Schofield et al. | 5,963,247 A | 10/1999 | Banitt |
| 5,796,176 A | 8/1998 | Kramer et al. | 5,963,284 A | 10/1999 | Jones et al. |
| 5,798,057 A | 8/1998 | Hikmet | 5,965,247 A | 10/1999 | Jonza et al. |
| 5,798,575 A | 8/1998 | O'Farrell et al. | 5,968,538 A | 10/1999 | Snyder, Jr. |
| 5,798,688 A | 8/1998 | Schofield | 5,971,552 A | 10/1999 | O'Farrell et al. |
| 5,800,918 A | 9/1998 | Chartier et al. | 5,973,760 A | 10/1999 | Dehmlow |
| 5,802,727 A | 9/1998 | Blank et al. | 5,975,715 A | 11/1999 | Bauder |
| 5,803,579 A | 9/1998 | Turnbull et al. | 5,984,482 A | 11/1999 | Rumsey et al. |
| 5,805,330 A | 9/1998 | Byker et al. | 5,986,730 A | 11/1999 | Hansen et al. |
| 5,805,367 A | 9/1998 | Kanazawa | 5,990,469 A | 11/1999 | Bechtel et al. |
| 5,806,879 A | 9/1998 | Hamada et al. | 5,990,625 A | 11/1999 | Meissner et al. |
| 5,806,965 A | 9/1998 | Deese | 5,995,180 A | 11/1999 | Moriwaki et al. |
| 5,808,197 A | 9/1998 | Dao | 5,998,617 A | 12/1999 | Srinivasa et al. |
| 5,808,566 A | 9/1998 | Behr et al. | 5,998,929 A | 12/1999 | Bechtel et al. |
| 5,808,589 A | 9/1998 | Fergason | 6,000,823 A | 12/1999 | Desmond et al. |
| 5,808,713 A | 9/1998 | Broer et al. | 6,001,486 A | 12/1999 | Varaprasad et al. |
| 5,808,777 A | 9/1998 | Lynam et al. | 6,002,511 A | 12/1999 | Varaprasad et al. |
| 5,808,778 A | 9/1998 | Bauer et al. | 6,002,983 A | 12/1999 | Alland et al. |
| 5,812,321 A | 9/1998 | Schierbeek et al. | 6,005,724 A | 12/1999 | Todd |
| 5,813,745 A | 9/1998 | Fant, Jr. et al. | 6,007,222 A | 12/1999 | Thau |
| 5,818,625 A | 10/1998 | Forgette et al. | 6,008,486 A | 12/1999 | Stam et al. |
| 5,820,097 A | 10/1998 | Spooner | 6,008,871 A | 12/1999 | Okumura |
| 5,820,245 A | 10/1998 | Desmond et al. | 6,009,359 A | 12/1999 | El-Hakim et al. |
| 5,822,023 A | 10/1998 | Suman et al. | 6,016,035 A | 1/2000 | Eberspächer et al. |
| 5,823,654 A | 10/1998 | Pastrick et al. | 6,016,215 A | 1/2000 | Byker |
| 5,825,527 A | 10/1998 | Forgette et al. | 6,019,411 A | 2/2000 | Carter et al. |

| Patent Number | Date | Inventor(s) | Patent Number | Date | Inventor(s) |
|---|---|---|---|---|---|
| 6,019,475 A | 2/2000 | Lynam et al. | 6,142,656 A | 11/2000 | Kurth |
| 6,020,987 A | 2/2000 | Baumann et al. | 6,146,003 A | 11/2000 | Thau |
| 6,021,371 A | 2/2000 | Fultz | 6,147,934 A | 11/2000 | Arikawa et al. |
| 6,023,229 A | 2/2000 | Bugno et al. | 6,148,261 A | 11/2000 | Obradovich et al. |
| 6,025,872 A | 2/2000 | Ozaki et al. | 6,149,287 A | 11/2000 | Pastrick et al. |
| 6,028,537 A | 2/2000 | Suman et al. | 6,150,014 A | 11/2000 | Chu et al. |
| 6,037,689 A | 3/2000 | Bingle et al. | 6,151,065 A | 11/2000 | Steed et al. |
| 6,040,939 A | 3/2000 | Demiryont et al. | 6,151,539 A | 11/2000 | Bergholz et al. |
| 6,042,253 A | 3/2000 | Fant, Jr. et al. | 6,152,551 A | 11/2000 | Annas |
| 6,042,934 A | 3/2000 | Guiselin et al. | 6,152,590 A | 11/2000 | Fürst et al. |
| 6,045,243 A | 4/2000 | Muth et al. | 6,154,149 A | 11/2000 | Tyckowski et al. |
| 6,045,643 A | 4/2000 | Byker et al. | 6,154,306 A | 11/2000 | Varaprasad et al. |
| 6,046,766 A | 4/2000 | Sakata | 6,157,294 A | 12/2000 | Urai et al. |
| 6,046,837 A | 4/2000 | Yamamoto | 6,157,418 A | 12/2000 | Rosen |
| 6,049,171 A | 4/2000 | Stam et al. | 6,157,424 A | 12/2000 | Eichenlaub |
| D425,466 S | 5/2000 | Todd et al. | 6,157,480 A | 12/2000 | Anderson et al. |
| 6,060,989 A | 5/2000 | Gehlot | 6,158,655 A | 12/2000 | DeVries, Jr. et al. |
| 6,061,002 A | 5/2000 | Weber et al. | 6,161,865 A | 12/2000 | Rose et al. |
| 6,062,920 A | 5/2000 | Jordan et al. | 6,164,564 A | 12/2000 | Franco et al. |
| 6,064,508 A | 5/2000 | Forgette et al. | 6,166,625 A | 12/2000 | Teowee et al. |
| 6,065,840 A | 5/2000 | Caskey et al. | 6,166,629 A | 12/2000 | Hamma et al. |
| 6,066,920 A | 5/2000 | Torihara et al. | 6,166,834 A | 12/2000 | Taketomi et al. |
| 6,067,111 A | 5/2000 | Hahn et al. | 6,166,847 A | 12/2000 | Tench et al. |
| 6,067,500 A | 5/2000 | Morimoto et al. | 6,166,848 A | 12/2000 | Cammenga et al. |
| 6,068,380 A | 5/2000 | Lynn et al. | 6,167,255 A | 12/2000 | Kennedy, III et al. |
| D426,506 S | 6/2000 | Todd et al. | 6,167,755 B1 | 1/2001 | Damson et al. |
| D426,507 S | 6/2000 | Todd et al. | 6,169,955 B1 | 1/2001 | Fultz |
| D427,128 S | 6/2000 | Mathieu | 6,170,956 B1 | 1/2001 | Rumsey et al. |
| 6,072,391 A | 6/2000 | Suzukie et al. | 6,172,600 B1 | 1/2001 | Kakinama et al. |
| 6,074,077 A | 6/2000 | Pastrick et al. | 6,172,601 B1 | 1/2001 | Wada et al. |
| 6,074,777 A | 6/2000 | Reimers et al. | 6,172,613 B1 | 1/2001 | DeLine et al. |
| 6,076,948 A | 6/2000 | Bukosky et al. | 6,173,501 B1 | 1/2001 | Blank et al. |
| 6,078,355 A | 6/2000 | Zengel | 6,175,164 B1 | 1/2001 | O'Farrell et al. |
| 6,078,865 A | 6/2000 | Koyanagi | 6,175,300 B1 | 1/2001 | Kendrick |
| D428,372 S | 7/2000 | Todd et al. | 6,176,602 B1 | 1/2001 | Pastrick et al. |
| D428,373 S | 7/2000 | Todd et al. | 6,178,034 B1 | 1/2001 | Allemand et al. |
| 6,082,881 A | 7/2000 | Hicks | 6,178,377 B1 | 1/2001 | Ishihara et al. |
| 6,084,700 A | 7/2000 | Knapp et al. | 6,181,387 B1 | 1/2001 | Rosen |
| 6,086,131 A | 7/2000 | Bingle et al. | 6,182,006 B1 | 1/2001 | Meek |
| 6,086,229 A | 7/2000 | Pastrick | 6,183,119 B1 | 2/2001 | Desmond et al. |
| 6,087,012 A | 7/2000 | Varaprasad et al. | 6,184,679 B1 | 2/2001 | Popovic et al. |
| 6,087,953 A | 7/2000 | DeLine et al. | 6,184,781 B1 | 2/2001 | Ramakesavan |
| 6,091,343 A | 7/2000 | Dykema et al. | 6,185,492 B1 | 2/2001 | Kagawa et al. |
| 6,093,976 A | 7/2000 | Kramer et al. | 6,185,501 B1 | 2/2001 | Smith et al. |
| 6,094,618 A | 7/2000 | Harada | 6,188,505 B1 | 2/2001 | Lomprey et al. |
| D428,842 S | 8/2000 | Todd et al. | 6,191,704 B1 | 2/2001 | Takenaga et al. |
| D429,202 S | 8/2000 | Todd et al. | 6,193,379 B1 | 2/2001 | Tonar et al. |
| D430,088 S | 8/2000 | Todd et al. | 6,193,912 B1 | 2/2001 | Thieste et al. |
| 6,097,023 A | 8/2000 | Schofield et al. | 6,195,194 B1 | 2/2001 | Roberts et al. |
| 6,097,316 A | 8/2000 | Liaw et al. | 6,196,688 B1 | 3/2001 | Caskey et al. |
| 6,099,131 A | 8/2000 | Fletcher et al. | 6,198,409 B1 | 3/2001 | Schofield et al. |
| 6,099,155 A | 8/2000 | Pastrick et al. | 6,199,014 B1 | 3/2001 | Walker et al. |
| 6,102,546 A | 8/2000 | Carter | 6,199,810 B1 | 3/2001 | Wu et al. |
| 6,102,559 A | 8/2000 | Nold et al. | 6,200,010 B1 | 3/2001 | Anders |
| 6,104,552 A | 8/2000 | Thau et al. | 6,201,642 B1 | 3/2001 | Bos |
| 6,106,121 A | 8/2000 | Buckley et al. | 6,206,553 B1 | 3/2001 | Boddy et al. |
| 6,111,498 A | 8/2000 | Jobes, I et al. | 6,207,083 B1 | 3/2001 | Varaprasad et al. |
| 6,111,683 A | 8/2000 | Cammenga et al. | 6,210,008 B1 | 4/2001 | Hoekstra et al. |
| 6,111,684 A | 8/2000 | Forgette et al. | 6,210,012 B1 | 4/2001 | Broer |
| 6,111,685 A | 8/2000 | Tench et al. | 6,212,470 B1 | 4/2001 | Seymour et al. |
| 6,111,696 A | 8/2000 | Allen et al. | 6,217,181 B1 | 4/2001 | Lynam et al. |
| 6,115,086 A | 9/2000 | Rosen | 6,218,934 B1 | 4/2001 | Regan |
| 6,115,651 A | 9/2000 | Cruz | 6,222,447 B1 | 4/2001 | Schofield et al. |
| 6,116,743 A | 9/2000 | Hoek | 6,222,460 B1 | 4/2001 | DeLine et al. |
| 6,118,219 A | 9/2000 | Okigami et al. | 6,222,689 B1 | 4/2001 | Higuchi et al. |
| 6,122,597 A | 9/2000 | Saneyoshi et al. | 6,227,689 B1 | 5/2001 | Miller |
| 6,122,921 A | 9/2000 | Brezoczky et al. | 6,232,937 B1 | 5/2001 | Jacobsen et al. |
| 6,124,647 A | 9/2000 | Marcus et al. | 6,236,514 B1 | 5/2001 | Sato |
| 6,124,886 A | 9/2000 | DeLine et al. | 6,239,851 B1 | 5/2001 | Hatazawa et al. |
| 6,127,919 A | 10/2000 | Wylin | 6,239,898 B1 | 5/2001 | Byker et al. |
| 6,127,945 A | 10/2000 | Mura-Smith | 6,239,899 B1 | 5/2001 | DeVries et al. |
| 6,128,576 A | 10/2000 | Nishimoto et al. | 6,243,003 B1 | 6/2001 | DeLine et al. |
| 6,130,421 A | 10/2000 | Bechtel et al. | 6,244,716 B1 | 6/2001 | Steenwyk et al. |
| 6,130,448 A | 10/2000 | Bauer et al. | 6,245,262 B1 | 6/2001 | Varaprasad et al. |
| 6,132,072 A | 10/2000 | Turnbull et al. | 6,247,820 B1 | 6/2001 | Van Order |
| 6,137,620 A | 10/2000 | Guarr et al. | 6,249,214 B1 | 6/2001 | Kashiwazaki |
| 6,139,171 A | 10/2000 | Waldmann | 6,249,310 B1 | 6/2001 | Lefkowitz |
| 6,139,172 A | 10/2000 | Bos et al. | 6,249,369 B1 | 6/2001 | Theiste et al. |
| 6,140,933 A | 10/2000 | Bugno et al. | 6,250,148 B1 | 6/2001 | Lynam |

| Patent Number | Date | Inventor |
|---|---|---|
| 6,250,766 B1 | 6/2001 | Strumolo et al. |
| 6,250,783 B1 | 6/2001 | Stidham et al. |
| 6,255,639 B1 | 7/2001 | Stam et al. |
| 6,257,746 B1 | 7/2001 | Todd et al. |
| 6,259,412 B1 | 7/2001 | Duroux |
| 6,259,475 B1 | 7/2001 | Ramachandran et al. |
| 6,260,608 B1 | 7/2001 | Kim |
| 6,262,842 B1 | 7/2001 | Ouderkirk et al. |
| 6,264,353 B1 | 7/2001 | Caraher et al. |
| 6,265,968 B1 | 7/2001 | Betzitza et al. |
| 6,268,803 B1 | 7/2001 | Gunderson et al. |
| 6,268,837 B1 | 7/2001 | Kobayashi et al. |
| 6,269,308 B1 | 7/2001 | Kodaka et al. |
| 6,271,901 B1 | 8/2001 | Ide et al. |
| 6,274,221 B2 | 8/2001 | Smith et al. |
| 6,276,821 B1 | 8/2001 | Pastrick et al. |
| 6,276,822 B1 | 8/2001 | Bedrosian et al. |
| 6,277,471 B1 | 8/2001 | Tang |
| 6,278,271 B1 | 8/2001 | Schott |
| 6,278,377 B1 | 8/2001 | DeLine et al. |
| 6,278,941 B1 | 8/2001 | Yokoyama |
| 6,280,068 B1 | 8/2001 | Mertens et al. |
| 6,280,069 B1 | 8/2001 | Pastrick et al. |
| 6,281,804 B1 | 8/2001 | Haller et al. |
| 6,286,965 B1 | 9/2001 | Caskey et al. |
| 6,286,984 B1 | 9/2001 | Berg |
| 6,289,332 B2 | 9/2001 | Menig et al. |
| 6,290,378 B1 | 9/2001 | Buchalla et al. |
| 6,291,905 B1 | 9/2001 | Drummond et al. |
| 6,291,906 B1 | 9/2001 | Marcus et al. |
| 6,294,989 B1 | 9/2001 | Schofield et al. |
| 6,296,379 B1 | 10/2001 | Pastrick |
| 6,297,781 B1 | 10/2001 | Turnbull et al. |
| 6,299,333 B1 | 10/2001 | Pastrick et al. |
| 6,300,879 B1 | 10/2001 | Ragan et al. |
| 6,301,039 B1 | 10/2001 | Tench |
| 6,304,173 B2 | 10/2001 | Pala et al. |
| 6,305,807 B1 | 10/2001 | Schierbeek |
| 6,310,611 B1 | 10/2001 | Caldwell |
| 6,310,714 B1 | 10/2001 | Lomprey et al. |
| 6,310,738 B1 | 10/2001 | Chu |
| 6,313,454 B1 | 11/2001 | Bos et al. |
| 6,314,295 B1 | 11/2001 | Kawamoto |
| 6,315,440 B1 | 11/2001 | Satoh |
| 6,317,057 B1 | 11/2001 | Lee |
| 6,317,180 B1 | 11/2001 | Kuroiwa et al. |
| 6,317,248 B1 | 11/2001 | Agrawal et al. |
| 6,318,870 B1 | 11/2001 | Spooner et al. |
| 6,320,176 B1 | 11/2001 | Schofield et al. |
| 6,320,282 B1 | 11/2001 | Caldwell |
| 6,320,612 B1 | 11/2001 | Young |
| 6,324,295 B1 | 11/2001 | Valery et al. |
| 6,326,613 B1 | 12/2001 | Heslin et al. |
| 6,326,900 B2 | 12/2001 | DeLine et al. |
| 6,329,925 B1 | 12/2001 | Skiver et al. |
| 6,330,511 B2 | 12/2001 | Ogura et al. |
| 6,331,066 B1 | 12/2001 | Desmond et al. |
| 6,333,759 B1 | 12/2001 | Mazzilli |
| 6,335,680 B1 | 1/2002 | Matsuoka |
| 6,336,737 B1 | 1/2002 | Thau |
| 6,340,850 B2 | 1/2002 | O'Farrell et al. |
| 6,341,523 B2 | 1/2002 | Lynam |
| 6,344,805 B1 | 2/2002 | Yasui et al. |
| 6,346,698 B1 | 2/2002 | Turnbull |
| 6,347,880 B1 | 2/2002 | Fürst et al. |
| 6,348,858 B2 | 2/2002 | Weis et al. |
| 6,351,708 B1 | 2/2002 | Takagi et al. |
| 6,353,392 B1 | 3/2002 | Schofield et al. |
| 6,356,206 B1 | 3/2002 | Takenaga et al. |
| 6,356,376 B1 | 3/2002 | Tonar et al. |
| 6,356,389 B1 | 3/2002 | Nilsen et al. |
| 6,357,883 B1 | 3/2002 | Strumolo et al. |
| 6,362,121 B1 | 3/2002 | Chopin et al. |
| 6,362,548 B1 | 3/2002 | Bingle et al. |
| 6,363,326 B1 | 3/2002 | Scully |
| 6,366,013 B1 | 4/2002 | Leenders et al. |
| 6,366,213 B2 | 4/2002 | DeLine et al. |
| 6,369,701 B1 | 4/2002 | Yoshida et al. |
| 6,370,329 B1 | 4/2002 | Teuchert |
| 6,371,636 B1 | 4/2002 | Wesson |
| 6,379,013 B1 | 4/2002 | Bechtel et al. |
| 6,379,788 B2 | 4/2002 | Choi et al. |
| 6,382,805 B1 | 5/2002 | Miyabukuro |
| 6,385,139 B1 | 5/2002 | Arikawa et al. |
| 6,386,742 B1 | 5/2002 | DeLine et al. |
| 6,390,529 B1 | 5/2002 | Bingle et al. |
| 6,390,626 B2 | 5/2002 | Knox |
| 6,390,635 B2 | 5/2002 | Whitehead et al. |
| 6,396,397 B1 | 5/2002 | Bos et al. |
| 6,396,408 B2 | 5/2002 | Drummond et al. |
| 6,396,637 B2 | 5/2002 | Roest et al. |
| 6,407,468 B1 | 6/2002 | LeVesque et al. |
| 6,407,847 B1 | 6/2002 | Poll et al. |
| 6,408,247 B1 | 6/2002 | Ichikawa et al. |
| 6,411,204 B1 | 6/2002 | Bloomfield et al. |
| 6,412,959 B1 | 7/2002 | Tseng |
| 6,412,973 B1 | 7/2002 | Bos et al. |
| 6,414,910 B1 | 7/2002 | Kaneko et al. |
| 6,415,230 B1 | 7/2002 | Maruko et al. |
| 6,416,208 B2 | 7/2002 | Pastrick et al. |
| 6,417,786 B2 | 7/2002 | Learman et al. |
| 6,418,376 B1 | 7/2002 | Olson |
| 6,419,300 B1 | 7/2002 | Pavao et al. |
| 6,420,036 B1 | 7/2002 | Varaprasad et al. |
| 6,420,800 B1 | 7/2002 | LeVesque et al. |
| 6,420,975 B1 | 7/2002 | DeLine et al. |
| 6,421,081 B1 | 7/2002 | Markus |
| 6,424,272 B1 | 7/2002 | Gutta et al. |
| 6,424,273 B1 | 7/2002 | Gutta et al. |
| 6,424,786 B1 | 7/2002 | Beeson et al. |
| 6,424,892 B1 | 7/2002 | Matsuoka |
| 6,426,492 B1 | 7/2002 | Bos et al. |
| 6,426,568 B2 | 7/2002 | Turnbull et al. |
| 6,427,349 B1 | 8/2002 | Blank et al. |
| 6,428,172 B1 | 8/2002 | Hutzel et al. |
| 6,433,676 B2 | 8/2002 | DeLine et al. |
| 6,433,680 B1 | 8/2002 | Ho |
| 6,433,914 B1 | 8/2002 | Lomprey et al. |
| 6,437,688 B1 | 8/2002 | Kobayashi |
| 6,438,491 B1 | 8/2002 | Farmer |
| 6,439,755 B1 | 8/2002 | Fant, Jr. et al. |
| 6,441,872 B1 | 8/2002 | Ho |
| 6,441,943 B1 | 8/2002 | Roberts et al. |
| 6,441,963 B2 | 8/2002 | Murakami et al. |
| 6,441,964 B1 | 8/2002 | Chu et al. |
| 6,445,287 B1 | 9/2002 | Schofield et al. |
| 6,447,128 B1 | 9/2002 | Lang et al. |
| 6,449,082 B1 | 9/2002 | Agrawal et al. |
| 6,452,533 B1 | 9/2002 | Yamabuchi et al. |
| 6,452,572 B1 | 9/2002 | Fan et al. |
| 6,462,795 B1 | 10/2002 | Clarke |
| 6,463,369 B2 | 10/2002 | Sadano et al. |
| 6,466,701 B1 | 10/2002 | Ejiri et al. |
| 6,471,362 B1 | 10/2002 | Carter et al. |
| 6,472,977 B1 | 10/2002 | Pöchmüller |
| 6,472,979 B2 | 10/2002 | Schofield et al. |
| 6,473,001 B1 | 10/2002 | Blum |
| 6,474,853 B2 | 11/2002 | Pastrick et al. |
| 6,476,731 B1 | 11/2002 | Miki et al. |
| 6,476,855 B1 | 11/2002 | Yamamoto |
| 6,477,460 B2 | 11/2002 | Kepler |
| 6,477,464 B2 | 11/2002 | McCarthy et al. |
| 6,483,429 B1 | 11/2002 | Yasui et al. |
| 6,483,438 B2 | 11/2002 | DeLine et al. |
| 6,483,613 B1 | 11/2002 | Woodgate et al. |
| 6,487,500 B2 | 11/2002 | Lemelson et al. |
| 6,494,602 B2 | 12/2002 | Pastrick et al. |
| 6,498,620 B2 | 12/2002 | Schofield et al. |
| 6,501,387 B2 | 12/2002 | Skiver et al. |
| 6,512,203 B2 | 1/2003 | Jones et al. |
| 6,512,624 B2 | 1/2003 | Tonar et al. |
| 6,513,252 B1 | 2/2003 | Schierbeek et al. |
| 6,515,378 B2 | 2/2003 | Drummond et al. |
| 6,515,581 B1 | 2/2003 | Ho |
| 6,515,582 B1 | 2/2003 | Teowee |
| 6,515,597 B1 | 2/2003 | Wada et al. |
| 6,516,664 B2 | 2/2003 | Lynam |
| 6,518,691 B1 | 2/2003 | Baba |

| | | |
|---|---|---|
| 6,519,209 B1 | 2/2003 | Arikawa et al. |
| 6,520,667 B1 | 2/2003 | Mousseau |
| 6,522,451 B1 | 2/2003 | Lynam |
| 6,522,969 B2 | 2/2003 | Kannonji |
| 6,525,707 B1 | 2/2003 | Kaneko et al. |
| 6,534,884 B2 | 3/2003 | Marcus et al. |
| 6,538,709 B1 | 3/2003 | Kurihara et al. |
| 6,539,306 B2 | 3/2003 | Turnbull et al. |
| 6,542,085 B1 | 4/2003 | Yang |
| 6,542,182 B1 | 4/2003 | Chautorash |
| 6,543,163 B1 | 4/2003 | Ginsberg |
| 6,545,598 B1 | 4/2003 | de Villeroche |
| 6,549,253 B1 | 4/2003 | Robbie et al. |
| 6,549,335 B1 | 4/2003 | Trapani et al. |
| 6,550,949 B1 | 4/2003 | Bauer et al. |
| 6,552,326 B2 | 4/2003 | Turnbull |
| 6,552,653 B2 | 4/2003 | Nakaho et al. |
| 6,553,308 B1 | 4/2003 | Uhlmann et al. |
| 6,559,761 B1 | 5/2003 | Miller et al. |
| 6,559,902 B1 | 5/2003 | Kusuda et al. |
| 6,560,004 B2 | 5/2003 | Theiste et al. |
| 6,560,027 B2 | 5/2003 | Meine |
| 6,566,821 B2 | 5/2003 | Nakatsuka et al. |
| 6,567,060 B1 | 5/2003 | Seklguchi |
| 6,568,839 B1 | 5/2003 | Pastrick et al. |
| 6,572,233 B1 | 6/2003 | Northman et al. |
| 6,573,957 B1 | 6/2003 | Suzuki |
| 6,573,963 B2 | 6/2003 | Ouderkirk et al. |
| 6,575,582 B2 | 6/2003 | Tenmyo |
| 6,575,643 B2 | 6/2003 | Takashashi |
| 6,578,989 B2 | 6/2003 | Osumi et al. |
| 6,580,373 B1 | 6/2003 | Ohashi |
| 6,580,479 B1 | 6/2003 | Sekiguchi et al. |
| 6,580,562 B2 | 6/2003 | Aoki et al. |
| 6,581,007 B2 | 6/2003 | Hasegawa et al. |
| 6,583,730 B2 | 6/2003 | Lang et al. |
| 6,591,192 B2 | 7/2003 | Okamura et al. |
| 6,592,230 B2 | 7/2003 | Dupay |
| 6,593,565 B2 | 7/2003 | Heslin et al. |
| 6,593,984 B2 | 7/2003 | Arakawa et al. |
| 6,594,065 B2 | 7/2003 | Byker et al. |
| 6,594,067 B2 | 7/2003 | Poll et al. |
| 6,594,090 B2 | 7/2003 | Kruschwitz et al. |
| 6,594,583 B2 | 7/2003 | Ogura et al. |
| 6,594,614 B2 | 7/2003 | Studt et al. |
| 6,595,649 B2 | 7/2003 | Hoekstra et al. |
| 6,597,489 B1 | 7/2003 | Guarr et al. |
| 6,606,183 B2 | 8/2003 | Ikai et al. |
| 6,611,202 B2 | 8/2003 | Schofield et al. |
| 6,611,227 B1 | 8/2003 | Nebiyeloul-Kifle et al. |
| 6,611,759 B2 | 8/2003 | Brosche |
| 6,612,723 B2 | 9/2003 | Futhey et al. |
| 6,614,387 B1 | 9/2003 | Deadman |
| 6,614,419 B1 | 9/2003 | May |
| 6,614,579 B2 | 9/2003 | Roberts et al. |
| 6,615,438 B1 | 9/2003 | Franco et al. |
| 6,616,313 B2 | 9/2003 | Fürst et al. |
| 6,616,764 B2 | 9/2003 | Krämer et al. |
| 6,618,672 B2 | 9/2003 | Sasaki et al. |
| 6,621,616 B1 | 9/2003 | Bauer et al. |
| 6,624,936 B2 | 9/2003 | Kotchick et al. |
| 6,627,918 B2 | 9/2003 | Getz et al. |
| 6,630,888 B2 | 10/2003 | Lang et al. |
| 6,636,190 B2 | 10/2003 | Hirakata et al. |
| 6,636,258 B2 | 10/2003 | Strumolo |
| 6,638,582 B1 | 10/2003 | Uchiyama et al. |
| 6,639,360 B2 | 10/2003 | Roberts et al. |
| 6,642,840 B2 | 11/2003 | Lang et al. |
| 6,642,851 B2 | 11/2003 | DeLine et al. |
| 6,646,697 B1 | 11/2003 | Sekiguchi et al. |
| 6,648,477 B2 | 11/2003 | Hutzel et al. |
| 6,650,457 B2 | 11/2003 | Busscher et al. |
| 6,657,607 B1 | 12/2003 | Evanicky et al. |
| 6,657,708 B1 | 12/2003 | Drevillon et al. |
| 6,661,482 B2 | 12/2003 | Hara |
| 6,661,830 B1 | 12/2003 | Reed et al. |
| 6,663,262 B2 | 12/2003 | Boyd et al. |
| 6,665,592 B2 | 12/2003 | Kodama |
| 6,669,109 B2 | 12/2003 | Ivanov et al. |
| 6,669,285 B1 | 12/2003 | Park et al. |
| 6,670,207 B1 | 12/2003 | Roberts |
| 6,670,910 B2 | 12/2003 | Delcheccolo et al. |
| 6,670,935 B2 | 12/2003 | Yeon et al. |
| 6,670,941 B2 | 12/2003 | Albu et al. |
| 6,671,080 B2 | 12/2003 | Poll et al. |
| 6,672,731 B2 | 1/2004 | Schnell et al. |
| 6,672,734 B2 | 1/2004 | Lammers |
| 6,672,744 B2 | 1/2004 | DeLine et al. |
| 6,672,745 B1 | 1/2004 | Bauer et al. |
| 6,674,370 B2 | 1/2004 | Rodewald et al. |
| 6,675,075 B1 | 1/2004 | Engelsburg et al. |
| 6,678,083 B1 | 1/2004 | Anstee |
| 6,678,614 B2 | 1/2004 | McCarthy et al. |
| 6,679,608 B2 | 1/2004 | Bechtel et al. |
| 6,683,539 B2 | 1/2004 | Trajkovic et al. |
| 6,683,969 B1 | 1/2004 | Nishigaki et al. |
| 6,685,348 B2 | 2/2004 | Pastrick et al. |
| 6,690,262 B1 | 2/2004 | Winnett |
| 6,690,268 B2 | 2/2004 | Schofield et al. |
| 6,690,413 B1 | 2/2004 | Moore |
| 6,690,438 B2 | 2/2004 | Sekiguchi |
| 6,693,517 B2 | 2/2004 | McCarthy et al. |
| 6,693,518 B2 | 2/2004 | Kumata et al. |
| 6,693,519 B2 | 2/2004 | Keirstead |
| 6,693,524 B1 | 2/2004 | Payne |
| 6,700,692 B2 | 3/2004 | Tonar et al. |
| 6,704,434 B1 | 3/2004 | Sakoh et al. |
| 6,709,136 B2 | 3/2004 | Pastrick et al. |
| 6,713,783 B1 | 3/2004 | Mase et al. |
| 6,717,109 B1 | 4/2004 | Macher et al. |
| 6,717,610 B1 | 4/2004 | Bos et al. |
| 6,717,712 B2 | 4/2004 | Lynam et al. |
| 6,719,215 B2 | 4/2004 | Droulliard |
| 6,724,446 B2 | 4/2004 | Motomura et al. |
| 6,726,337 B2 | 4/2004 | Whitehead et al. |
| 6,727,807 B2 | 4/2004 | Trajkovic et al. |
| 6,727,808 B1 | 4/2004 | Uselmann et al. |
| 6,727,844 B2 | 4/2004 | Zimmermann et al. |
| 6,731,332 B1 | 5/2004 | Yasui et al. |
| 6,734,807 B2 | 5/2004 | King |
| 6,736,526 B2 | 5/2004 | Matsuba et al. |
| 6,737,629 B2 | 5/2004 | Nixon et al. |
| 6,737,630 B2 | 5/2004 | Turnbull |
| 6,737,964 B2 | 5/2004 | Samman et al. |
| 6,738,088 B1 | 5/2004 | Uskolovsky et al. |
| 6,742,904 B2 | 6/2004 | Bechtel et al. |
| 6,744,353 B2 | 6/2004 | Sjönell |
| 6,746,775 B1 | 6/2004 | Boire et al. |
| 6,747,716 B2 | 6/2004 | Kuroiwa et al. |
| 6,748,211 B1 | 6/2004 | Isaac et al. |
| 6,749,308 B1 | 6/2004 | Niendorf et al. |
| 6,755,542 B2 | 6/2004 | Bechtel et al. |
| 6,756,912 B2 | 6/2004 | Skiver et al. |
| 6,757,039 B2 | 6/2004 | Ma |
| 6,757,109 B2 | 6/2004 | Bos |
| D493,131 S | 7/2004 | Lawlor et al. |
| D493,394 S | 7/2004 | Lawlor et al. |
| 6,759,113 B1 | 7/2004 | Tang |
| 6,759,945 B2 | 7/2004 | Richard |
| 6,760,157 B1 | 7/2004 | Allen et al. |
| 6,765,480 B2 | 7/2004 | Tseng |
| 6,773,116 B2 | 8/2004 | De Vaan et al. |
| 6,774,356 B2 | 8/2004 | Heslin et al. |
| 6,774,810 B2 | 8/2004 | DeLine et al. |
| 6,778,904 B2 | 8/2004 | Iwami et al. |
| 6,779,900 B1 | 8/2004 | Nolan-Brown |
| 6,781,738 B2 | 8/2004 | Kikuchi et al. |
| 6,782,718 B2 | 8/2004 | Lingle et al. |
| 6,784,129 B2 | 8/2004 | Seto et al. |
| 6,797,396 B1 | 9/2004 | Liu et al. |
| 6,800,871 B2 | 10/2004 | Matsuda et al. |
| 6,801,127 B2 | 10/2004 | Mizusawa et al. |
| 6,801,244 B2 | 10/2004 | Takeda et al. |
| 6,801,283 B2 | 10/2004 | Koyama et al. |
| 6,805,474 B2 | 10/2004 | Walser et al. |
| 6,806,452 B2 | 10/2004 | Bos et al. |
| 6,806,922 B2 | 10/2004 | Ishitaka |
| 6,810,323 B1 | 10/2004 | Bullock et al. |

| | | | | | | | |
|---|---|---|---|---|---|---|---|
| 6,812,463 | B2 | 11/2004 | Okada | 7,004,592 | B2 | 2/2006 | Varaprasad et al. |
| 6,812,907 | B1 | 11/2004 | Gennetten et al. | 7,004,593 | B2 | 2/2006 | Weller et al. |
| 6,819,231 | B2 | 11/2004 | Berberich et al. | 7,005,974 | B2 | 2/2006 | McMahon et al. |
| 6,823,261 | B2 | 11/2004 | Sekiguchi | 7,006,173 | B1 | 2/2006 | Hiyama et al. |
| 6,824,281 | B2 | 11/2004 | Schofield et al. | 7,008,090 | B2 | 3/2006 | Blank |
| 6,831,268 | B2 | 12/2004 | Bechtel et al. | 7,009,751 | B2 | 3/2006 | Tonar et al. |
| 6,832,848 | B2 | 12/2004 | Pastrick | 7,012,543 | B2 | 3/2006 | DeLine et al. |
| 6,834,969 | B2 | 12/2004 | Bade et al. | 7,012,727 | B2 | 3/2006 | Hutzel et al. |
| 6,836,725 | B2 | 12/2004 | Millington et al. | 7,023,331 | B2 | 4/2006 | Kodama |
| 6,838,980 | B2 | 1/2005 | Gloger et al. | 7,029,156 | B2 | 4/2006 | Suehiro et al. |
| 6,842,189 | B2 | 1/2005 | Park | 7,030,738 | B2 | 4/2006 | Ishii |
| 6,842,276 | B2 | 1/2005 | Poll et al. | 7,030,775 | B2 | 4/2006 | Sekiguchi |
| 6,845,805 | B1 | 1/2005 | Köster | 7,038,577 | B2 | 5/2006 | Pawlicki et al. |
| 6,846,098 | B2 | 1/2005 | Bourdelais et al. | 7,041,965 | B2 | 5/2006 | Heslin et al. |
| 6,847,424 | B2 | 1/2005 | Gotoh et al. | 7,042,616 | B2 | 5/2006 | Tonar et al. |
| 6,847,487 | B2 | 1/2005 | Burgner | 7,046,418 | B2 | 5/2006 | Lin et al. |
| 6,848,817 | B2 | 2/2005 | Bos et al. | 7,046,448 | B2 | 5/2006 | Burgner |
| 6,849,165 | B2 | 2/2005 | Klöppel et al. | 7,050,908 | B1 | 5/2006 | Schwartz et al. |
| 6,853,491 | B1 | 2/2005 | Ruhle et al. | 7,057,505 | B2 | 6/2006 | Iwamoto |
| 6,859,148 | B2 | 2/2005 | Miller et al. | 7,057,681 | B2 | 6/2006 | Hinata et al. |
| 6,861,789 | B2 | 3/2005 | Wei | 7,063,893 | B2 | 6/2006 | Hoffman |
| 6,870,655 | B1 | 3/2005 | Northman et al. | 7,064,882 | B2 | 6/2006 | Tonar et al. |
| 6,870,656 | B2 | 3/2005 | Tonar et al. | 7,068,289 | B2 | 6/2006 | Satoh et al. |
| 6,871,982 | B2 | 3/2005 | Holman et al. | 7,074,486 | B2 | 7/2006 | Boire et al. |
| 6,877,888 | B2 | 4/2005 | DeLine et al. | 7,081,810 | B2 | 7/2006 | Henderson et al. |
| 6,882,287 | B2 | 4/2005 | Schofield | 7,085,633 | B2 | 8/2006 | Nishira et al. |
| 6,889,064 | B2 | 5/2005 | Baratono et al. | 7,092,052 | B2 | 8/2006 | Okamoto et al. |
| 6,891,563 | B2 | 5/2005 | Schofield et al. | 7,095,432 | B2 | 8/2006 | Nakayama et al. |
| 6,891,677 | B2 | 5/2005 | Nilsen et al. | 7,095,567 | B2 | 8/2006 | Troxell et al. |
| 6,898,518 | B2 | 5/2005 | Padmanabhan | 7,106,213 | B2 | 9/2006 | White |
| 6,902,284 | B2 | 6/2005 | Hutzel et al. | 7,106,392 | B2 | 9/2006 | You |
| 6,904,348 | B2 | 6/2005 | Drummond et al. | 7,108,409 | B2 | 9/2006 | DeLine et al. |
| 6,906,620 | B2 | 6/2005 | Nakai et al. | 7,110,021 | B2 | 9/2006 | Nobori et al. |
| 6,906,632 | B2 | 6/2005 | DeLine et al. | 7,114,554 | B2 | 10/2006 | Bergman et al. |
| 6,909,486 | B2 | 6/2005 | Wang et al. | 7,121,028 | B2 | 10/2006 | Shoen et al. |
| 6,910,779 | B2 | 6/2005 | Abel et al. | 7,125,131 | B2 | 10/2006 | Olczak |
| 6,912,001 | B2 | 6/2005 | Okamoto et al. | 7,130,727 | B2 | 10/2006 | Liu et al. |
| 6,912,396 | B2 | 6/2005 | Sziraki et al. | 7,132,064 | B2 | 11/2006 | Li et al. |
| 6,914,521 | B2 | 7/2005 | Rothkop | 7,136,091 | B2 | 11/2006 | Ichikawa et al. |
| 6,916,099 | B2 | 7/2005 | Su et al. | 7,138,974 | B2 | 11/2006 | Hirakata et al. |
| 6,917,404 | B2 | 7/2005 | Baek | 7,149,613 | B2 | 12/2006 | Stam et al. |
| 6,918,674 | B2 | 7/2005 | Drummond et al. | 7,150,552 | B2 | 12/2006 | Weidel |
| 6,922,902 | B2 | 8/2005 | Schierbeek et al. | 7,151,515 | B2 | 12/2006 | Kim et al. |
| 6,923,080 | B1 | 8/2005 | Dobler et al. | 7,151,997 | B2 | 12/2006 | Uhlmann et al. |
| 6,928,180 | B2 | 8/2005 | Stam et al. | 7,153,588 | B2 | 12/2006 | McMan et al. |
| 6,928,366 | B2 | 8/2005 | Ockerse et al. | 7,154,657 | B2 | 12/2006 | Poll et al. |
| 6,930,737 | B2 | 8/2005 | Weindorf et al. | 7,158,881 | B2 | 1/2007 | McCarthy et al. |
| 6,933,837 | B2 | 8/2005 | Gunderson et al. | 7,160,017 | B2 | 1/2007 | Lee et al. |
| 6,934,067 | B2 | 8/2005 | Ash et al. | 7,161,567 | B2 | 1/2007 | Homma et al. |
| 6,940,423 | B2 | 9/2005 | Takagi et al. | 7,167,796 | B2 | 1/2007 | Taylor et al. |
| 6,946,978 | B2 | 9/2005 | Schofield | 7,168,830 | B2 | 1/2007 | Pastrick et al. |
| 6,947,576 | B2 | 9/2005 | Stam et al. | 7,175,291 | B1 | 2/2007 | Li |
| 6,947,577 | B2 | 9/2005 | Stam et al. | 7,176,790 | B2 | 2/2007 | Yamazaki |
| 6,949,772 | B2 | 9/2005 | Shimizu et al. | 7,184,190 | B2 | 2/2007 | McCabe et al. |
| 6,950,035 | B2 | 9/2005 | Tanaka et al. | 7,185,995 | B2 | 3/2007 | Hatanaka et al. |
| 6,951,410 | B2 | 10/2005 | Parsons | 7,187,498 | B2 | 3/2007 | Bengoechea et al. |
| 6,951,681 | B2 | 10/2005 | Hartley et al. | 7,188,963 | B2 | 3/2007 | Schofield et al. |
| 6,952,312 | B2 | 10/2005 | Weber et al. | 7,193,764 | B2 | 3/2007 | Lin et al. |
| 6,958,495 | B2 | 10/2005 | Nishijima et al. | 7,195,381 | B2 | 3/2007 | Lynam et al. |
| 6,958,683 | B2 | 10/2005 | Mills et al. | 7,199,767 | B2 | 4/2007 | Spero |
| 6,959,994 | B2 | 11/2005 | Fujikawa et al. | 7,202,987 | B2 | 4/2007 | Varaprasad et al. |
| 6,961,178 | B2 | 11/2005 | Sugino et al. | 7,206,697 | B2 | 4/2007 | Olney et al. |
| 6,961,661 | B2 | 11/2005 | Sekiguchi | 7,209,277 | B2 | 4/2007 | Tonar et al. |
| 6,963,438 | B2 | 11/2005 | Busscher et al. | 7,215,238 | B2 | 5/2007 | Buck et al. |
| 6,968,273 | B2 | 11/2005 | Ockerse et al. | 7,215,473 | B2 | 5/2007 | Fleming |
| 6,971,181 | B2 | 12/2005 | Ohm et al. | 7,221,363 | B2 | 5/2007 | Roberts et al. |
| 6,972,888 | B2 | 12/2005 | Poll et al. | 7,221,365 | B1 | 5/2007 | Lévesque et al. |
| 6,974,236 | B2 | 12/2005 | Tenmyo | 7,224,324 | B2 | 5/2007 | Quist et al. |
| 6,975,215 | B2 | 12/2005 | Schofield et al. | 7,227,472 | B1 | 6/2007 | Roe |
| 6,977,702 | B2 | 12/2005 | Wu | 7,230,523 | B2 | 6/2007 | Harter, Jr. et al. |
| 6,980,092 | B2 | 12/2005 | Turnbull et al. | 7,232,231 | B2 | 6/2007 | Shih |
| 6,985,291 | B2 | 1/2006 | Watson et al. | 7,232,594 | B2 | 6/2007 | Miroshin et al. |
| 6,989,736 | B2 | 1/2006 | Berberich et al. | 7,233,304 | B1 | 6/2007 | Aratani et al. |
| 6,992,573 | B2 | 1/2006 | Blank et al. | 7,235,918 | B2 | 6/2007 | McCullough et al. |
| 6,992,718 | B1 | 1/2006 | Takahara | 7,241,030 | B2 | 7/2007 | Mok et al. |
| 6,992,826 | B2 | 1/2006 | Wong | 7,241,037 | B2 | 7/2007 | Mathieu et al. |
| 6,995,687 | B2 | 2/2006 | Lang et al. | 7,245,207 | B1 | 7/2007 | Dayan et al. |
| 6,997,571 | B2 | 2/2006 | Tenmyo | 7,245,231 | B2 | 7/2007 | Kiefer et al. |
| 7,001,058 | B2 | 2/2006 | Inditsky | 7,245,336 | B2 | 7/2007 | Hiyama et al. |

| Patent | Date | Inventor |
|---|---|---|
| 7,248,283 B2 | 7/2007 | Takagi et al. |
| 7,248,305 B2 | 7/2007 | Ootsuta et al. |
| 7,249,860 B2 | 7/2007 | Kulas et al. |
| 7,251,079 B2 | 7/2007 | Capaldo et al. |
| 7,253,723 B2 | 8/2007 | Lindahl et al. |
| 7,255,451 B2 | 8/2007 | McCabe et al. |
| 7,255,465 B2 | 8/2007 | DeLine et al. |
| 7,259,036 B2 | 8/2007 | Borland et al. |
| 7,262,406 B2 | 8/2007 | Heslin et al. |
| 7,262,916 B2 | 8/2007 | Kao et al. |
| 7,265,342 B2 | 9/2007 | Heslin et al. |
| 7,268,841 B2 | 9/2007 | Kasajima et al. |
| 7,269,327 B2 | 9/2007 | Tang |
| 7,269,328 B2 | 9/2007 | Tang |
| 7,271,951 B2 | 9/2007 | Weber et al. |
| 7,274,501 B2 | 9/2007 | McCabe et al. |
| 7,281,491 B2 | 10/2007 | Iwamaru |
| 7,286,280 B2 | 10/2007 | Whitehead et al. |
| 7,287,868 B2 | 10/2007 | Carter et al. |
| 7,289,037 B2 | 10/2007 | Uken et al. |
| 7,290,919 B2 | 11/2007 | Pan et al. |
| 7,292,208 B1 | 11/2007 | Park et al. |
| 7,300,183 B2 | 11/2007 | Kiyomoto et al. |
| 7,302,344 B2 | 11/2007 | Olney et al. |
| 7,304,661 B2 | 12/2007 | Ishikura |
| 7,308,341 B2 | 12/2007 | Schofield et al. |
| 7,310,177 B2 | 12/2007 | McCabe et al. |
| 7,311,428 B2 | 12/2007 | DeLine et al. |
| 7,316,485 B2 | 1/2008 | Roose |
| 7,317,386 B2 | 1/2008 | Lengning et al. |
| 7,318,664 B2 | 1/2008 | Hatanaka et al. |
| 7,323,819 B2 | 1/2008 | Hong et al. |
| 7,324,043 B2 | 1/2008 | Purden et al. |
| 7,324,172 B2 | 1/2008 | Yamazaki et al. |
| 7,324,174 B2 | 1/2008 | Hafuka et al. |
| 7,324,261 B2 | 1/2008 | Tonar et al. |
| 7,327,225 B2 | 2/2008 | Nicholas et al. |
| 7,327,226 B2 | 2/2008 | Turnbull et al. |
| 7,327,855 B1 | 2/2008 | Chen |
| 7,328,103 B2 | 2/2008 | McCarthy et al. |
| 7,329,013 B2 | 2/2008 | Blank et al. |
| 7,329,850 B2 | 2/2008 | Drummond et al. |
| 7,331,415 B2 | 2/2008 | Hawes et al. |
| 7,338,177 B2 | 3/2008 | Lynam |
| 7,342,707 B2 | 3/2008 | Roberts et al. |
| 7,344,284 B2 | 3/2008 | Lynam et al. |
| 7,349,143 B2 | 3/2008 | Tonar et al. |
| 7,349,144 B2 | 3/2008 | Varaprasad et al. |
| 7,349,582 B2 | 3/2008 | Takeda et al. |
| 7,355,524 B2 | 4/2008 | Schofield |
| 7,360,932 B2 | 4/2008 | Uken et al. |
| 7,362,505 B2 | 4/2008 | Hikmet et al. |
| 7,368,714 B2 | 5/2008 | Remillard et al. |
| 7,370,983 B2 | 5/2008 | DeWind et al. |
| 7,372,611 B2 | 5/2008 | Tonar et al. |
| 7,375,895 B2 | 5/2008 | Brynielsson |
| 7,379,224 B2 | 5/2008 | Tonar et al. |
| 7,379,225 B2 | 5/2008 | Tonar et al. |
| 7,379,243 B2 | 5/2008 | Horsten et al. |
| 7,379,814 B2 | 5/2008 | Ockerse et al. |
| 7,379,817 B1 | 5/2008 | Tyson et al. |
| 7,380,633 B2 | 6/2008 | Shen et al. |
| 7,389,171 B2 | 6/2008 | Rupp |
| 7,391,563 B2 | 6/2008 | McCabe et al. |
| 7,396,147 B2 | 7/2008 | Munro |
| 7,411,637 B2 | 8/2008 | Weiss |
| 7,411,732 B2 | 8/2008 | Kao et al. |
| 7,412,328 B2 | 8/2008 | Uhlmann et al. |
| 7,417,781 B2 | 8/2008 | Tonar et al. |
| 7,420,159 B2 | 9/2008 | Heslin et al. |
| 7,420,756 B2 | 9/2008 | Lynam |
| 7,429,998 B2 | 9/2008 | Kawauchi et al. |
| 7,446,462 B2 | 11/2008 | Lim et al. |
| 7,446,650 B2 | 11/2008 | Schofield et al. |
| 7,446,924 B2 | 11/2008 | Schofield et al. |
| 7,448,776 B2 | 11/2008 | Tang |
| 7,452,090 B2 | 11/2008 | Weller et al. |
| 7,453,057 B2 | 11/2008 | Drummond et al. |
| 7,455,412 B2 | 11/2008 | Rottcher |
| 7,460,007 B2 | 12/2008 | Schofield et al. |
| 7,467,883 B2 | 12/2008 | DeLine et al. |
| 7,468,651 B2 | 12/2008 | DeLine et al. |
| 7,471,438 B2 | 12/2008 | McCabe et al. |
| 7,474,963 B2 | 1/2009 | Taylor et al. |
| 7,477,439 B2 | 1/2009 | Tonar et al. |
| 7,480,149 B2 | 1/2009 | DeWard et al. |
| 7,488,080 B2 | 2/2009 | Skiver et al. |
| 7,488,099 B2 | 2/2009 | Fogg et al. |
| 7,489,374 B2 | 2/2009 | Utsumi et al. |
| 7,490,007 B2 | 2/2009 | Taylor et al. |
| 7,490,943 B2 | 2/2009 | Kikuchi et al. |
| 7,490,944 B2 | 2/2009 | Blank et al. |
| 7,494,231 B2 | 2/2009 | Varaprasad et al. |
| 7,495,719 B2 | 2/2009 | Adachi et al. |
| 7,496,439 B2 | 2/2009 | McCormick |
| 7,502,156 B2 | 3/2009 | Tonar et al. |
| 7,505,047 B2 | 3/2009 | Yoshimura |
| 7,505,188 B2 | 3/2009 | Niiyama et al. |
| 7,511,607 B2 | 3/2009 | Hubbard et al. |
| 7,511,872 B2 | 3/2009 | Tonar et al. |
| 7,525,604 B2 | 4/2009 | Xue |
| 7,525,715 B2 | 4/2009 | McCabe et al. |
| 7,526,103 B2 | 4/2009 | Schofield et al. |
| 7,533,998 B2 | 5/2009 | Schofield et al. |
| 7,538,316 B2 | 5/2009 | Heslin et al. |
| 7,540,620 B2 | 6/2009 | Weller et al. |
| 7,541,570 B2 | 6/2009 | Drummond et al. |
| 7,542,193 B2 | 6/2009 | McCabe et al. |
| 7,543,946 B2 | 6/2009 | Ockerse et al. |
| 7,543,947 B2 | 6/2009 | Varaprasad et al. |
| 7,545,429 B2 | 6/2009 | Travis |
| 7,547,467 B2 | 6/2009 | Olson et al. |
| 7,548,291 B2 | 6/2009 | Lee et al. |
| 7,551,354 B2 | 6/2009 | Horsten et al. |
| 7,561,181 B2 | 7/2009 | Schofield et al. |
| 7,562,985 B2 | 7/2009 | Cortenraad et al. |
| 7,567,291 B2 | 7/2009 | Bechtel et al. |
| 7,571,038 B2 | 8/2009 | Butler et al. |
| 7,571,042 B2 | 8/2009 | Taylor et al. |
| 7,572,017 B2 | 8/2009 | Varaprasad et al. |
| 7,572,490 B2 | 8/2009 | Park et al. |
| 7,579,939 B2 | 8/2009 | Schofield et al. |
| 7,579,940 B2 | 8/2009 | Schofield et al. |
| 7,580,795 B2 | 8/2009 | McCarthy et al. |
| 7,581,859 B2 | 9/2009 | Lynam |
| 7,581,867 B2 | 9/2009 | Lee et al. |
| 7,583,184 B2 | 9/2009 | Schofield et al. |
| 7,586,566 B2 | 9/2009 | Nelson et al. |
| 7,586,666 B2 | 9/2009 | McCabe et al. |
| 7,589,883 B2 | 9/2009 | Varaprasad et al. |
| 7,589,893 B2 | 9/2009 | Rottcher |
| 7,600,878 B2 | 10/2009 | Blank et al. |
| 7,605,883 B2 | 10/2009 | Yamaki et al. |
| 7,619,508 B2 | 11/2009 | Lynam et al. |
| 7,623,202 B2 | 11/2009 | Araki et al. |
| 7,626,749 B2 | 12/2009 | Baur et al. |
| 7,629,996 B2 | 12/2009 | Rademacher et al. |
| 7,633,567 B2 | 12/2009 | Yamada et al. |
| 7,636,188 B2 | 12/2009 | Baur et al. |
| 7,636,195 B2 | 12/2009 | Nieuwkerk et al. |
| 7,636,930 B2 | 12/2009 | Chang |
| 7,643,200 B2 | 1/2010 | Varaprasad et al. |
| 7,643,927 B2 | 1/2010 | Hils |
| 7,651,228 B2 | 1/2010 | Skiver et al. |
| 7,658,521 B2 | 2/2010 | DeLine et al. |
| 7,663,798 B2 | 2/2010 | Tonar et al. |
| 7,667,579 B2 | 2/2010 | DeLine et al. |
| 7,670,016 B2 | 3/2010 | Weller et al. |
| 7,688,495 B2 | 3/2010 | Tonar et al. |
| 7,695,174 B2 | 4/2010 | Takayanagi et al. |
| 7,696,964 B2 | 4/2010 | Lankhorst et al. |
| 7,706,046 B2 | 4/2010 | Bauer et al. |
| 7,710,631 B2 | 5/2010 | McCabe et al. |
| 7,711,479 B2 | 5/2010 | Taylor et al. |
| 7,724,434 B2 | 5/2010 | Cross et al. |
| 7,726,822 B2 | 6/2010 | Blank et al. |
| 7,728,276 B2 | 6/2010 | Drummond et al. |
| 7,728,721 B2 | 6/2010 | Schofield et al. |

| Patent Number | Date | Inventor |
|---|---|---|
| 7,728,927 B2 | 6/2010 | Nieuwkerk et al. |
| 7,731,403 B2 | 6/2010 | Lynam et al. |
| 7,734,392 B2 | 6/2010 | Schofield et al. |
| 7,742,864 B2 | 6/2010 | Sekiguchi |
| 7,746,534 B2 | 6/2010 | Tonar et al. |
| 7,771,061 B2 | 8/2010 | Varaprasad et al. |
| 7,787,077 B2 | 8/2010 | Kondoh et al. |
| 7,791,694 B2 | 9/2010 | Molsen et al. |
| 7,795,675 B2 | 9/2010 | Darwish et al. |
| 7,815,326 B2 | 10/2010 | Blank et al. |
| 7,821,697 B2 | 10/2010 | Varaprasad et al. |
| 7,822,543 B2 | 10/2010 | Taylor et al. |
| 7,826,123 B2 | 11/2010 | McCabe et al. |
| 7,830,583 B2 | 11/2010 | Neuman et al. |
| 7,832,882 B2 | 11/2010 | Weller et al. |
| 7,842,154 B2 | 11/2010 | Lynam |
| 7,854,514 B2 | 12/2010 | Conner et al. |
| 7,855,755 B2 | 12/2010 | Weller et al. |
| 7,859,565 B2 | 12/2010 | Schofield et al. |
| 7,859,737 B2 | 12/2010 | McCabe et al. |
| 7,864,398 B2 | 1/2011 | Dozeman et al. |
| 7,864,399 B2 | 1/2011 | McCabe et al. |
| 7,871,169 B2 | 1/2011 | Varaprasad et al. |
| 7,873,593 B2 | 1/2011 | Schofield et al. |
| 7,888,629 B2 | 2/2011 | Heslin et al. |
| 7,898,398 B2 | 3/2011 | DeLine et al. |
| 7,898,719 B2 | 3/2011 | Schofield et al. |
| 7,903,324 B2 | 3/2011 | Kobayashi et al. |
| 7,903,335 B2 | 3/2011 | Nieuwkerk et al. |
| 7,906,756 B2 | 3/2011 | Drummond et al. |
| 7,914,188 B2 | 3/2011 | DeLine et al. |
| 7,916,009 B2 | 3/2011 | Schofield et al. |
| 7,916,380 B2 | 3/2011 | Tonar et al. |
| 7,918,570 B2 | 4/2011 | Weller et al. |
| 7,926,960 B2 | 4/2011 | Skiver et al. |
| 7,937,667 B2 | 5/2011 | Kramer et al. |
| 7,965,336 B2 | 6/2011 | Bingle et al. |
| 7,965,357 B2 | 6/2011 | Van De Witte et al. |
| 7,980,711 B2 | 7/2011 | Takayanagi et al. |
| 7,994,471 B2 | 8/2011 | Heslin et al. |
| 8,000,894 B2 | 8/2011 | Taylor et al. |
| 8,004,768 B2 | 8/2011 | Takayanagi et al. |
| 8,019,505 B2 | 9/2011 | Schofield et al. |
| 8,027,691 B2 | 9/2011 | Bernas et al. |
| 8,031,225 B2 | 10/2011 | Watanabe et al. |
| 8,040,376 B2 | 10/2011 | Yamada et al. |
| 8,044,776 B2 | 10/2011 | Schofield et al. |
| 8,047,667 B2 | 11/2011 | Weller et al. |
| 8,049,640 B2 | 11/2011 | Uken et al. |
| 8,063,753 B2 | 11/2011 | DeLine et al. |
| 8,072,318 B2 | 12/2011 | Lynam et al. |
| 8,083,386 B2 | 12/2011 | Lynam |
| 8,094,002 B2 | 1/2012 | Schofield et al. |
| 8,095,260 B1 | 1/2012 | Schofield et al. |
| 8,095,310 B2 | 1/2012 | Taylor et al. |
| 8,100,568 B2 | 1/2012 | DeLine et al. |
| 8,106,347 B2 | 1/2012 | Drummond et al. |
| 8,121,787 B2 | 2/2012 | Taylor et al. |
| 8,134,117 B2 | 3/2012 | Heslin et al. |
| 8,144,033 B2 | 3/2012 | Chinomi et al. |
| 8,154,418 B2 | 4/2012 | Hook et al. |
| 8,162,493 B2 | 4/2012 | Skiver et al. |
| 8,164,814 B2 | 4/2012 | Varaprasad et al. |
| 8,169,307 B2 | 5/2012 | Nakamura et al. |
| 8,177,376 B2 | 5/2012 | Weller et al. |
| 8,179,236 B2 | 5/2012 | Weller et al. |
| 8,179,437 B2 | 5/2012 | Schofield et al. |
| 8,179,586 B2 | 5/2012 | Schofield et al. |
| 8,194,132 B2 | 6/2012 | Dayan et al. |
| 8,194,133 B2 | 6/2012 | De Wind et al. |
| 8,217,887 B2 | 7/2012 | Sangam et al. |
| 8,228,588 B2 | 7/2012 | McCabe et al. |
| 2001/0026316 A1 | 10/2001 | Senatore |
| 2001/0035853 A1 | 11/2001 | Hoelen et al. |
| 2002/0049535 A1 | 4/2002 | Rigo et al. |
| 2002/0085155 A1 | 7/2002 | Arikawa |
| 2002/0092958 A1 | 7/2002 | Lusk |
| 2002/0118321 A1 | 8/2002 | Ge |
| 2002/0133144 A1 | 9/2002 | Chan et al. |
| 2002/0149727 A1 | 10/2002 | Wang |
| 2002/0154007 A1 | 10/2002 | Yang |
| 2002/0171954 A1* | 11/2002 | Bonardi et al. ............ 359/877 |
| 2003/0002165 A1 | 1/2003 | Mathias et al. |
| 2003/0007261 A1 | 1/2003 | Hutzel et al. |
| 2003/0030724 A1 | 2/2003 | Okamoto |
| 2003/0069690 A1 | 4/2003 | Correia et al. |
| 2003/0090568 A1 | 5/2003 | Pico |
| 2003/0090569 A1 | 5/2003 | Poechmueller |
| 2003/0098908 A1 | 5/2003 | Misaiji et al. |
| 2003/0103142 A1 | 6/2003 | Hltomi et al. |
| 2003/0122929 A1 | 7/2003 | Minuado et al. |
| 2003/0133014 A1 | 7/2003 | Mendoza |
| 2003/0137586 A1 | 7/2003 | Lewellen |
| 2003/0156193 A1 | 8/2003 | Nakamura |
| 2003/0169158 A1 | 9/2003 | Paul, Jr. |
| 2003/0179293 A1 | 9/2003 | Oizumi |
| 2003/0202096 A1 | 10/2003 | Kim |
| 2003/0206256 A1 | 11/2003 | Drain et al. |
| 2003/0214576 A1 | 11/2003 | Koga |
| 2003/0214584 A1 | 11/2003 | Ross, Jr. |
| 2003/0227546 A1 | 12/2003 | Hilborn et al. |
| 2004/0004541 A1 | 1/2004 | Hong |
| 2004/0027695 A1 | 2/2004 | Lin |
| 2004/0036768 A1 | 2/2004 | Green |
| 2004/0080404 A1 | 4/2004 | White |
| 2004/0196577 A1* | 10/2004 | Carter et al. ............... 359/871 |
| 2004/0239243 A1 | 12/2004 | Roberts et al. |
| 2004/0239849 A1 | 12/2004 | Wang |
| 2005/0018738 A1 | 1/2005 | Duan et al. |
| 2005/0024591 A1 | 2/2005 | Lian et al. |
| 2005/0117095 A1 | 6/2005 | Ma |
| 2005/0168995 A1 | 8/2005 | Kittlemann et al. |
| 2005/0237440 A1 | 10/2005 | Sugimura et al. |
| 2005/0270766 A1 | 12/2005 | Kung et al. |
| 2006/0001641 A1 | 1/2006 | Degwekar et al. |
| 2006/0050018 A1 | 3/2006 | Hutzel et al. |
| 2006/0061008 A1 | 3/2006 | Karner et al. |
| 2006/0076860 A1 | 4/2006 | Hoss |
| 2006/0139953 A1 | 6/2006 | Chou et al. |
| 2006/0187378 A1 | 8/2006 | Bong et al. |
| 2006/0279522 A1 | 12/2006 | Kurihara |
| 2007/0064108 A1 | 3/2007 | Haler |
| 2007/0080585 A1 | 4/2007 | Lyu |
| 2007/0086097 A1 | 4/2007 | Motomiya et al. |
| 2007/0183037 A1 | 8/2007 | De Boer et al. |
| 2007/0262732 A1 | 11/2007 | Shen |
| 2008/0042938 A1 | 2/2008 | Cok |
| 2008/0068520 A1 | 3/2008 | Minikey, Jr. et al. |
| 2009/0002491 A1 | 1/2009 | Haler |
| 2009/0040778 A1 | 2/2009 | Takayanagi et al. |
| 2009/0052003 A1 | 2/2009 | Schofield et al. |
| 2009/0096937 A1 | 4/2009 | Bauer et al. |
| 2009/0201137 A1 | 8/2009 | Weller et al. |
| 2009/0258221 A1 | 10/2009 | Diehl et al. |
| 2009/0262192 A1 | 10/2009 | Schofield et al. |
| 2009/0296190 A1 | 12/2009 | Anderson et al. |
| 2010/0045899 A1 | 2/2010 | Ockerse |
| 2010/0110523 A1 | 5/2010 | Varaprasad et al. |
| 2010/0110553 A1 | 5/2010 | Anderson et al. |
| 2010/0195226 A1 | 8/2010 | Heslin et al. |
| 2010/0201896 A1 | 8/2010 | Ostreko et al. |
| 2010/0245701 A1 | 9/2010 | Sato et al. |
| 2010/0246017 A1 | 9/2010 | Tonar et al. |
| 2010/0277786 A1 | 11/2010 | Anderson et al. |
| 2010/0289995 A1 | 11/2010 | Hwang et al. |

FOREIGN PATENT DOCUMENTS

| | | |
|---|---|---|
| DE | 2808260 | 8/1979 |
| DE | 3248511 A1 | 7/1984 |
| DE | 3301945 | 7/1984 |
| DE | 3614882 | 11/1987 |
| DE | 3720848 | 1/1989 |
| DE | 9306989.8 U1 | 7/1993 |
| DE | 4329983 | 8/1995 |
| DE | 4444443 A1 | 6/1996 |
| DE | 29805142 U1 | 5/1998 |
| DE | 19741896 | 4/1999 |
| DE | 19755008 | 7/1999 |

| | | | | | | |
|---|---|---|---|---|---|---|
| DE | 19934999 | 2/2001 | | JP | 07-175035 | 7/1995 |
| DE | 19943355 | 3/2001 | | JP | 07-191311 | 7/1995 |
| DE | 20118868 | 3/2002 | | JP | 07-266928 | 10/1995 |
| DE | 10131459 | 1/2003 | | JP | 07-267002 | 10/1995 |
| DE | 102005000650 | 7/2006 | | JP | 07-277072 | 10/1995 |
| EP | 0299509 A2 | 1/1989 | | JP | 07-281150 | 10/1995 |
| EP | 0513476 A1 | 11/1992 | | JP | 07-281185 | 10/1995 |
| EP | 0524766 | 1/1993 | | JP | 08-008083 | 1/1996 |
| EP | 0729864 A1 | 12/1995 | | JP | 08-083581 | 3/1996 |
| EP | 0728618 A2 | 8/1996 | | JP | 08-216789 | 8/1996 |
| EP | 0825477 | 2/1998 | | JP | 08-227769 | 9/1996 |
| EP | 0830985 | 3/1998 | | JP | 09-033886 | 2/1997 |
| EP | 0928723 A2 | 7/1999 | | JP | 09-260074 | 3/1997 |
| EP | 937601 A2 | 8/1999 | | JP | 05-077657 | 7/1997 |
| EP | 1075986 | 2/2001 | | JP | 09-220976 | 8/1997 |
| EP | 1097848 A | 5/2001 | | JP | 09-230827 | 9/1997 |
| EP | 1152285 A2 | 11/2001 | | JP | 09-266078 | 10/1997 |
| EP | 1193773 | 3/2002 | | JP | 09-288262 | 11/1997 |
| EP | 1256833 | 11/2002 | | JP | 10-076880 | 3/1998 |
| EP | 0899157 | 10/2004 | | JP | 10-190960 | 7/1998 |
| EP | 1315639 | 2/2006 | | JP | 10-199480 | 7/1998 |
| FR | 2585991 | 2/1987 | | JP | 10-206643 | 8/1998 |
| FR | 2672857 A1 | 8/1992 | | JP | 10-221692 | 8/1998 |
| FR | 2673499 A1 | 9/1992 | | JP | 10-239659 | 9/1998 |
| GB | 810010 | 3/1959 | | JP | 10-276298 | 10/1998 |
| GB | 934037 | 8/1963 | | JP | 11-038381 | 2/1999 |
| GB | 1008411 | 10/1965 | | JP | 11-067485 | 3/1999 |
| GB | 1553376 | 9/1979 | | JP | 11-078693 | 3/1999 |
| GB | 2137573 A | 10/1984 | | JP | 11-109337 | 4/1999 |
| GB | 2161440 | 1/1986 | | JP | 11-160539 | 6/1999 |
| GB | 2192370 | 1/1988 | | JP | 11-212073 | 8/1999 |
| GB | 2222991 | 3/1990 | | JP | 11-283759 | 10/1999 |
| GB | 2255539 A | 11/1992 | | JP | 11-298058 | 10/1999 |
| GB | 2351055 A | 12/2000 | | JP | 11-305197 | 11/1999 |
| GB | 2362494 | 11/2001 | | JP | 2000-131681 | 5/2000 |
| JP | 50-000638 A | 1/1975 | | JP | 2000-153736 | 6/2000 |
| JP | 52-146988 | 11/1977 | | JP | 2000-159014 | 6/2000 |
| JP | 55-039843 | 3/1980 | | JP | 2000-255321 | 9/2000 |
| JP | 57-30639 | 2/1982 | | JP | 2000-330107 | 11/2000 |
| JP | 57-102602 | 6/1982 | | JP | 2001-083509 | 3/2001 |
| JP | 57-208530 | 12/1982 | | JP | 2001-097116 | 4/2001 |
| JP | 58-020954 | 2/1983 | | JP | 2001-222005 | 8/2001 |
| JP | 58-030729 | 2/1983 | | JP | 2002-072901 | 3/2002 |
| JP | 58-110334 | 6/1983 | | JP | 2002-120649 | 4/2002 |
| JP | 58-180347 | 10/1983 | | JP | 2002-122860 | 4/2002 |
| JP | 58-209635 | 12/1983 | | JP | 2002-162626 | 6/2002 |
| JP | 59-114139 | 7/1984 | | JP | 2002-352611 | 12/2002 |
| JP | 60-212730 | 10/1985 | | JP | 2003-182454 | 3/2003 |
| JP | 60-261275 | 12/1985 | | JP | 2003-267129 | 9/2003 |
| JP | 61-127186 | 6/1986 | | JP | 2004-182156 | 7/2004 |
| JP | 61-260217 | 11/1986 | | JP | 2005-148119 | 6/2005 |
| JP | 62-043543 | 2/1987 | | JP | 2005-280526 | 10/2005 |
| JP | 62-075619 | 4/1987 | | JP | 2005-327600 | 11/2005 |
| JP | 62-122487 | 6/1987 | | JP | 38-46073 | 11/2006 |
| JP | 62-131232 | 6/1987 | | JP | 2008-083657 | 4/2008 |
| JP | 63-02753 | 1/1988 | | KR | 20060038856 | 5/2006 |
| JP | 63-085525 | 4/1988 | | KR | 100663930 | 1/2007 |
| JP | 63-106730 | 5/1988 | | WO | WO 82/02448 | 7/1982 |
| JP | 63-106731 | 5/1988 | | WO | WO 86/06179 | 10/1986 |
| JP | 63-274286 | 11/1988 | | WO | WO 94/19212 | 9/1994 |
| JP | 01-123587 | 5/1989 | | WO | WO 96/21581 | 7/1996 |
| JP | 01-130578 | 5/1989 | | WO | WO 98/14974 | 4/1998 |
| JP | 02-122844 | 10/1990 | | WO | WO 98/38547 | 9/1998 |
| JP | 03-028947 | 3/1991 | | WO | WO 99/15360 | 4/1999 |
| JP | 03-28947 | 3/1991 | | WO | WO 00/23826 | 4/2000 |
| JP | 03-052097 | 3/1991 | | WO | WO 00/52661 | 9/2000 |
| JP | 30-061192 | 3/1991 | | WO | WO 00/55685 | 9/2000 |
| JP | 03-110855 | 5/1991 | | WO | WO 01/01192 | 1/2001 |
| JP | 03-198026 | 8/1991 | | WO | WO 02/18174 | 3/2002 |
| JP | 03-243914 | 10/1991 | | WO | WO 02/49881 | 6/2002 |
| JP | 04-245886 | 9/1992 | | WO | WO 03/021343 | 3/2003 |
| JP | 05-080716 | 4/1993 | | WO | WO 03/078941 | 9/2003 |
| JP | 05-183194 | 7/1993 | | | | |
| JP | 05-257142 | 10/1993 | | | | |
| JP | 60-80953 A | 3/1994 | | | | |
| JP | 61-07035 A | 4/1994 | | | | |
| JP | 62-27318 A | 8/1994 | | | | |
| JP | 06-318734 | 11/1994 | | | | |
| JP | 07-146467 | 6/1995 | | | | |

OTHER PUBLICATIONS

Kobe, Gerry; 42 Volts Goes Underhood; Mar. 2000; Automotive Industries; Cahners Publishing Company; www.findarticles.com/p/articles/mi_m3012/is_3_180/ai_61361677.

Jewett, Dale; Aug. 2000; Automotive Industries; Cahners Publishing Company; www.findarticles.com/p/articles/mi_m3012/is_8_180ai_64341779.

National Semiconductor, LM78S40, Universal Switching Regulator Subsystem, National Semiconductor Corporation, Apr. 1996, p. 6.

Dana H. Ballard and Christopher M. Brown, Computer Vision, Prentice-Hall, Englewood Cliffs, New Jersey, 5 pages, 1982.

G. Wang, D. Renshaw, P.B. Denyer and M. Lu, CMOS Video Cameras, article, 1991, 4 pages, University of Edinburgh, UK.

* cited by examiner

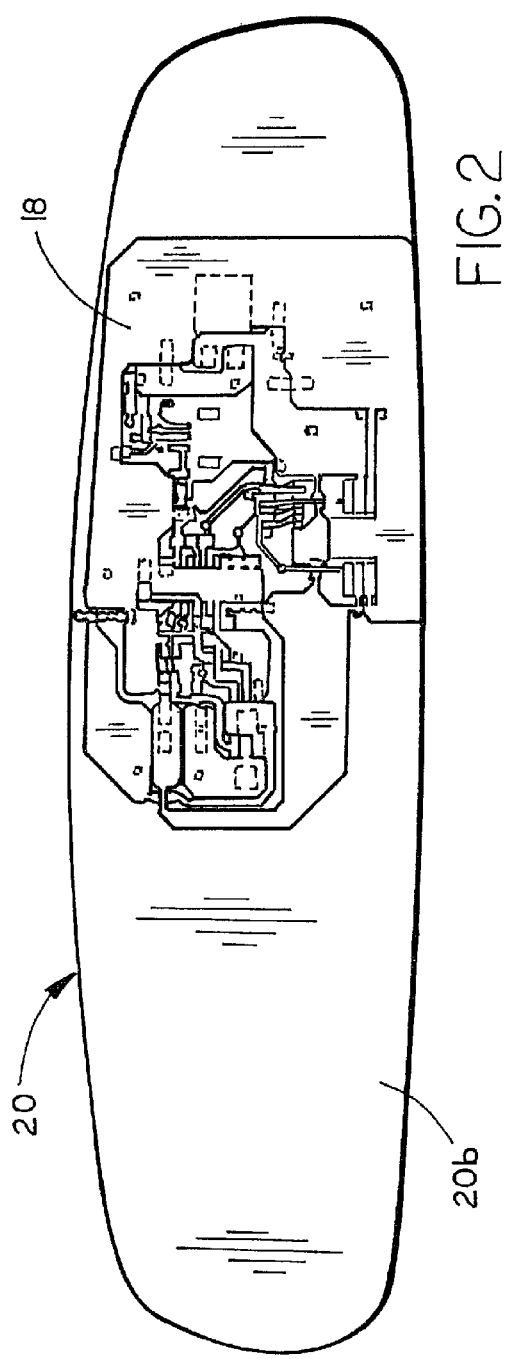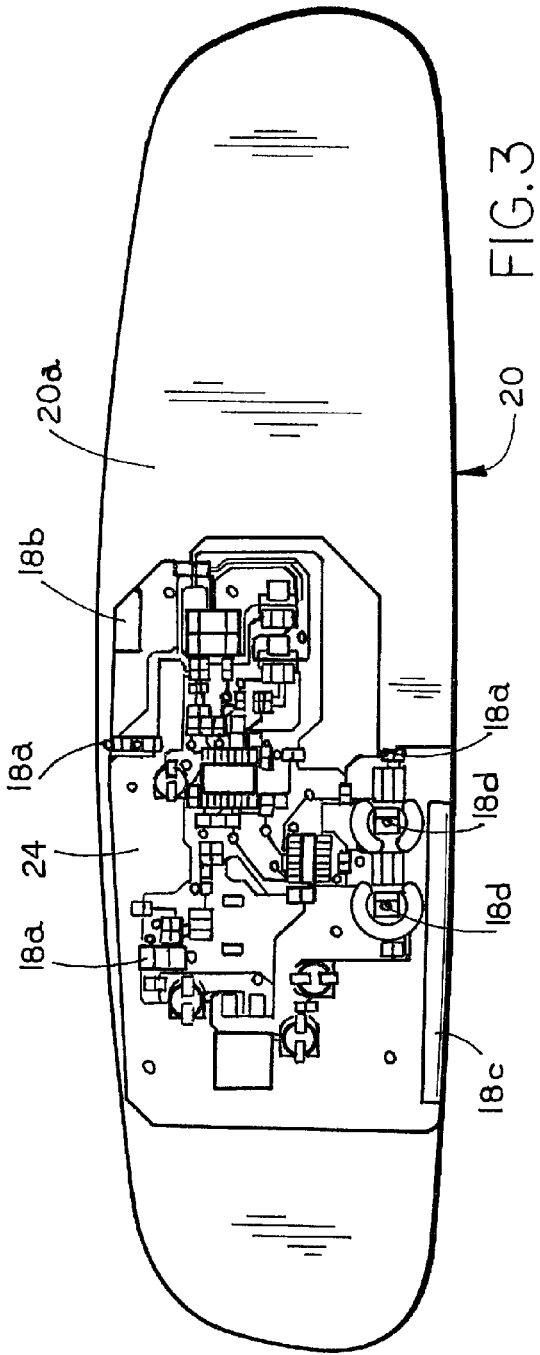

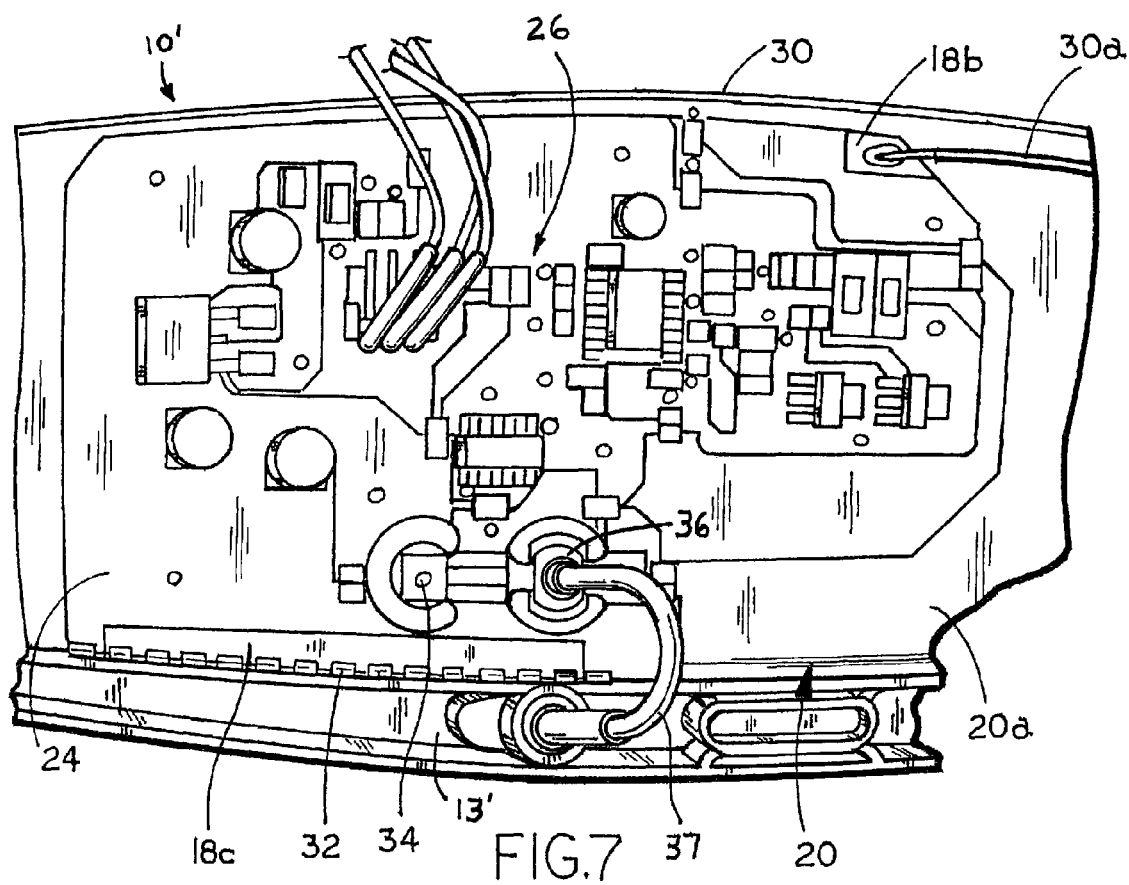

REARVIEW MIRROR ASSEMBLY FOR VEHICLE

CROSS REFERENCE TO RELATED APPLICATIONS

The present application is a continuation of U.S. patent application Ser. No. 13/033,951, filed Feb. 24, 2011, now U.S. Pat. No. 8,179,586, which is a continuation of U.S. patent application Ser. No. 12/580,499, filed Oct. 16, 2009, now U.S. Pat. No. 7,898,719, which is a continuation of U.S. patent application Ser. No. 12/260,499, filed Oct. 29, 2008, abandoned, which is a continuation of U.S. patent application Ser. No. 10/956,749, filed Oct. 1, 2004, now U.S. Pat. No. 7,446,924, which claims the benefit of U.S. provisional application Ser. No. 60/508,086, filed Oct. 2, 2003, which are hereby incorporated herein by reference in their entireties.

FIELD OF THE INVENTION

The present invention relates generally to rearview mirror assemblies for vehicles and, more particularly, to rearview mirror assemblies that include one or more electronic components, such as electro-optic or electrochromic interior rearview mirror assemblies. However, aspects of the present invention may be equally suitable for use in prismatic rearview mirror assemblies and/or for exterior rearview mirror assemblies.

BACKGROUND OF THE INVENTION

It is known to attach a printed circuit board to an attachment plate adhered or otherwise affixed to a rear surface of a mirror element, such as an electro-optic reflective element assembly or a prismatic reflective element. In order to attach the printed circuit board to the attachment plate, various connectors or clips may be employed at the attachment plate and/or the circuit board. The attachment plate is typically adhered to the rear surface of the mirror element or substrate, such as via a suitable adhesive or tape or the like. The printed circuit board has a rigid printed board or substrate that is cut or formed to a desired form and has conductive traces and circuitry applied to or placed on or attached to the board. The attachment plate and printed board/substrate include multiple parts and components at the rear of the mirror element, which may be costly to manufacture and assemble. The multiple components also add to the size, weight and volume requirements for the circuit board, which thus may add to the size and weight of the mirror assembly. Also, the printed board or substrate material may add to the weight and to the cost of the mirror assembly.

Therefore, there is a need in the art for an interior rearview mirror assembly that overcomes the shortcomings of the prior art.

SUMMARY OF THE INVENTION

The present invention provides an interior or exterior rearview mirror reflective element assembly that includes a conductive trace and circuitry printed on and/or applied at or to the rear surface of the mirror reflective element assembly, such as to the rear surface of the rear reflective element substrate of an electro-optic or electrochromic mirror reflective element assembly or cell. The circuitry thus may be applied to the existing hard or rigid reflective element substrate (typically glass) of the mirror reflective element assembly, such that the reflective element assembly comprises a circuitry on glass arrangement (although the reflective element substrate may comprise other materials, such as acrylic or polycarbonate or the like, without affecting the scope of the present invention), and does not require the additional printed board or substrate and attachment plate of conventional mirror assemblies. The glass substrate or reflective element substrate of the mirror reflective element assembly thus provides the hard or rigid surface for the conductive trace and electrical components and replaces the hard or rigid printed board or substrate of conventional printed circuit boards. The circuitry on glass assembly of the present invention may be applied to reflective elements or reflective element assemblies of interior mirror assemblies, such as interior rearview mirror assemblies and the like, or of exterior mirror assemblies, such as exterior rearview mirror assemblies and the like, or of other mirror assemblies of vehicles, without affecting the scope of the present invention.

According to an aspect of the present invention, a reflective element assembly for a mirror assembly of a vehicle includes a reflective element substrate (typically glass) having a rear surface (the surface facing generally away from the driver of the vehicle and facing generally forwardly with respect to the direction of travel of the vehicle when the mirror assembly is installed to the vehicle) and a front surface (the surface facing generally toward a driver of the vehicle and generally rearward with respect to the direction of travel of the vehicle when the mirror assembly is installed to the vehicle). The reflective element assembly includes a conductive trace or layer disposed at the rear surface of the reflective element substrate and a non-conductive layer applied to the conductive trace and covering at least some of the conductive trace and leaving at least one portion of the conductive trace exposed. The reflective element assembly includes at least one circuitry component that is applied to at least one of the portions of the conductive trace.

The reflective element substrate may have a reflective layer disposed at one of the front and rear surfaces for viewing by a driver of the vehicle when the mirror assembly is installed to the vehicle. The conductive trace and at least one circuitry component thus are disposed at the rear surface of the existing rigid reflective element substrate (typically glass) that includes or is associated with the reflective surface of the reflective element assembly that is viewable by the driver of the vehicle.

For example, a third surface electro-optic or electrochromic transflective element assembly may include a metallic reflective coating or layer and one or more non-metallic, semi-conductive layers disposed at or on a third surface or front surface of the rear or second reflective element substrate. The rear reflective element substrate of the electrochromic reflective element assembly is positioned rearward of the front reflective element substrate, with an electrochromic medium disposed between the front and rear reflective element substrates. The third surface transflective element assembly thus may provide a reflective surface for viewing by the driver of the vehicle through the front reflective element substrate of the reflective element assembly. Alternately, a fourth surface electro-optic or electrochromic reflective element assembly may have a reflective coating or layer disposed on a fourth or rear surface of the rear reflective element substrate for viewing by a driver of the vehicle through the front and rear reflective element substrates or glass substrates of the reflective element assembly or cell. Alternately, the rear surface of a prismatic element or substrate may have a reflective layer disposed thereon or applied thereto for viewing by the driver of the vehicle.

In any of these embodiments, the conductive trace of the present invention may be applied at the rear surface of the rear reflective element substrate (or the rear surface of the single substrate for prismatic type mirror assemblies) and rearward of the reflective layer or coating so that the conductive trace and electronic components are not viewable by the driver of the vehicle through the reflective element substrate or substrates of the reflective element assembly. In applications where the reflective layer is disposed at the rear or fourth surface of an electro-optic or electrochromic reflective element assembly or cell, an insulating layer may be applied at the rear surface and over the reflective layer or layers, whereby the conductive trace may be applied to the insulating layer. The present invention thus utilizes the existing reflective element substrate of the mirror reflective element assembly as the rigid substrate for receiving the conductive trace and electronic components and/or circuitry.

According to another aspect of the present invention, a method of manufacturing a reflective element assembly for an interior rearview mirror assembly of a vehicle includes providing a reflective element substrate having a front surface and a rear surface. The reflective element substrate has a reflective layer disposed at one of the front and rear surfaces for viewing by a driver of the vehicle when the mirror assembly is installed to the vehicle. A conductive trace or layer is applied to or disposed at the rear surface of the reflective element substrate. A non-conductive layer is applied to the conductive layer to cover at least some of the conductive layer and to leave at least one portion of the conductive layer exposed. At least one circuitry component is applied to the at least one exposed portion of the conductive layer. The conductive trace or layer may comprise a conductive epoxy, such as a conductive silver epoxy or the like, and may be applied in a desired pattern onto the rear surface of the reflective element substrate.

The method may include providing the non-conductive material or layer or mask over portions of the conductive trace while exposing other portions or pads for receiving at least one accessory and/or circuitry component or the like, such as sensors, resistors, capacitors, display elements, and the like, thereon. Optionally, a display element, such as a light emitting diode (LED) display element, a vacuum fluorescent (VF) display element, an electroluminescent (EL) display element, a liquid crystal display (LCD) element, or a video display element or the like, may be integrally formed at the rear surface of the reflective element substrate, such that the display information is viewable through the reflective element substrate. Optionally, at least one proximity sensor or antenna may be applied to or clipped to or attached to or positioned along a portion of the rear surface of the reflective element substrate. The at least one proximity sensor or antenna may be operable to detect a presence of a person's finger at or near the mirror assembly, such as at or near one of the sensors or at or near a corresponding icon on or at the mirror casing or bezel and at which or behind which the proximity sensor is located. The circuitry or component may be operable to actuate a display menu or the like and/or actuate or toggle or control an accessory in response to such a detection.

The accessories or circuitry or electrical components may be applied or adhered to the exposed portions or pads of the conductive trace before the conductive trace has cured, such that the curing of the conductive trace may secure the accessories and the like to the conductive trace, or the accessories or circuitry or components may be adhered or secured to the exposed portions after curing of the conductive trace, without affecting the scope of the present invention.

The mirror reflective element assembly may comprise an electro-optic or electrochromic mirror reflective element assembly or cell having first and second reflective element substrates. The conductive trace may be applied to the fourth or rear surface of the second or rear reflective element substrate of the electrochromic mirror reflective element assembly. The electrochromic mirror reflective element assembly or cell may include clips or busbars extending at least partially along the upper edge of one of the reflective element substrates and the lower edge of the other of the reflective element substrates. The conductive trace may include portions that extend substantially to the upper and lower edges of the second reflective element substrate to facilitate connection to the clips or busbars. The clips or busbars may contact portions of the conductive trace applied to the rear or fourth surface of the rear or second reflective element substrate to connect the busbars to the circuitry or the like associated with or connected to the conductive trace.

Therefore, the interior rearview mirror assembly of the present invention provides a mirror reflective element assembly, such as an electro-optic or electrochromic mirror reflective element assembly or cell or a prismatic reflective element assembly, that includes a conductive trace and circuitry applied to or disposed at a rear surface of a reflective element substrate, such as a rear glass substrate of an electro-optic or electrochromic reflective element assembly or a single glass substrate of a prismatic reflective element assembly or the like, such that at least one electronic component and/or circuitry is integral with the reflective element substrate of the reflective element assembly. The reflective element assembly thus provides a circuitry on glass arrangement and thus utilizes the existing rigid glass reflective element substrate of the reflective element assembly as the rigid surface that receives the conductive trace and circuitry or electronic components thereon. The electronic components and/or circuitry thus are not provided on a separate rigid printed board or substrate that may be snapped onto or otherwise attached to an attachment plate adhered to or otherwise positioned at the rear surface of the reflective element. The rearview mirror reflective element assembly of the present invention thus provides a compact reflective element assembly, which may be readily manufactured, because the reflective element assembly does not include an attachment plate or the like. The mirror reflective element assembly of the present invention thus may provide a low cost, lightweight and compact reflective element assembly that provides for enhanced manufacturing and assembly processes.

These and other objects, advantages, purposes and features of the present invention will become apparent upon review of the following specification in conjunction with the drawings.

BRIEF DESCRIPTION OF THE DRAWINGS

FIG. 2 is a front elevation of a rear reflective element substrate of a reflective element assembly of the mirror assembly of FIG. 1, viewing through the reflective element substrate to show a conductive trace applied to the rear surface of the substrate;

FIG. 3 is a rear elevation of the rear reflective element substrate of FIG. 2;

FIG. 7 is a rear perspective view of a portion of a reflective element assembly of the present invention, with a light pipe attached between circuitry on the reflective element substrate and a bezel portion of the mirror assembly.

DESCRIPTION OF THE PREFERRED EMBODIMENTS

Figure 1:
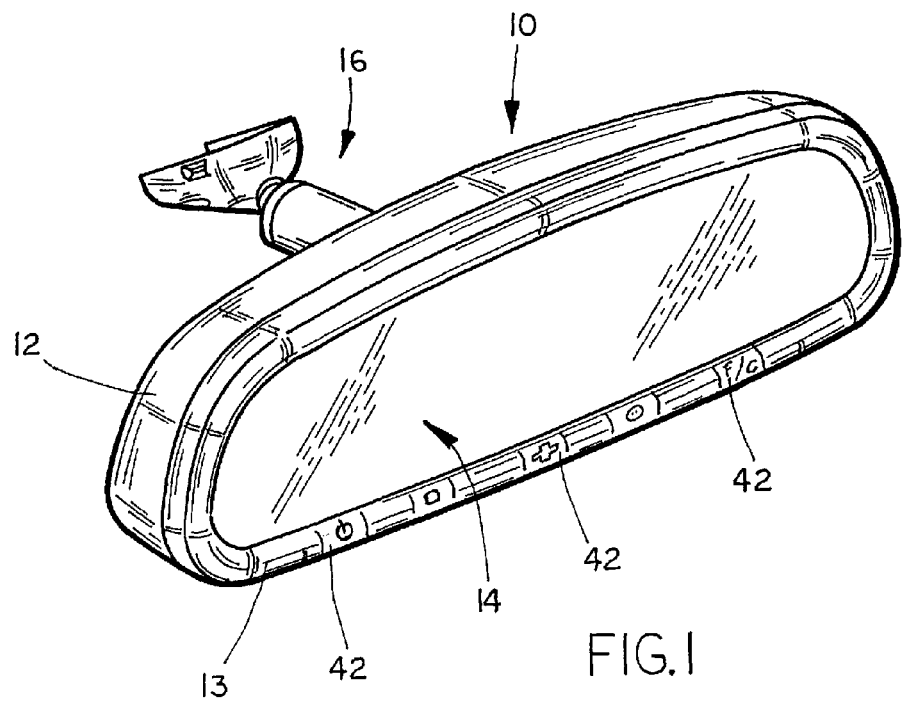
FIG. 1 is a perspective view of an interior rearview mirror assembly in accordance with the present invention.

Referring now to the drawings and the illustrative embodiments depicted therein, an interior rearview mirror assembly 10 includes a casing 12, a bezel 13, a reflective element assembly or cell 14 and a mounting arrangement 16 (FIG. 1) for adjustably mounting the casing and reflective element 14 to an interior portion of a vehicle, such as to a mounting button or the like at an interior surface of a windshield of a vehicle. Mirror reflective element assembly 14 includes a conductive trace or layer or coating 18 (FIG. 2) applied to or disposed on or at the rearward surface (the surface facing forward or in the direction of travel of the vehicle when the mirror assembly is installed in the vehicle) of a reflective element substrate, such as the typically glass substrate of the reflective element assembly, such as on the rear surface 20a (FIGS. 3-6) of a second or rear substrate or glass element 20 of an electro-optic or electrochromic mirror cell (commonly referred to as the fourth surface of the electrochromic mirror cell). The reflective element substrate 20 thus may provide a substantially rigid surface for receiving the conductive trace and circuitry, and the reflective element assembly thus may comprise a circuitry on glass arrangement, whereby no separate rigid printed board or substrate or attachment plate is necessary to support the conductive trace and circuitry at the rear of the reflective element substrate of the reflective element assembly. However, the reflective element assembly and/or the mirror assembly may include other electronic elements or circuitry that may not be positioned or disposed on the glass surface, and/or that may complement the circuitry on the glass substrate, without affecting the scope of the present invention.

In the illustrated embodiment, the reflective element assembly 14 comprises an electro-optic or electrochromic reflective element assembly or cell that includes a front reflective element substrate 22 and the rear reflective element substrate 20. The rear reflective element substrate 20 is spaced from front reflective element substrate 22 with an electrochromic medium 21 and conductive or semi-conductive layers disposed or sandwiched therebetween, as is known in the electrochromic mirror art. The conductive trace 18 may be applied directly onto the rear surface 20a (or onto an insulating epoxy or other type of layer or coating applied to the rear surface, as discussed below) of the reflective element substrate 20, and masking portions or layers of a non-conductive material 24 and circuitry components and/or accessories and the like may be applied directly to the conductive trace 18, such that no separate printed board and attachment plate and related components are required.

Although shown and described as an electrochromic reflective element assembly or cell, aspects of the present invention may be equally suitable for and applicable to a prismatic reflective element substrate and assembly or other types of reflective elements and assemblies, without affecting the scope of the present invention. Also, although shown and described as an interior reflective element assembly, aspects of the present invention may be equally suitable for and applicable to exterior mirror assemblies, such as exterior electrochromic rearview mirror assemblies and exterior rearview mirror assemblies with a single reflective element and the like, without affecting the scope of the present invention.

The conductive trace or layer 18 may comprise a conductive epoxy, such as a conductive silver epoxy or the like, that may be screen printed in a desired pattern or trace directly onto the rear surface 20a of rear reflective element substrate 20 of reflective element assembly 14 (or onto an insulating layer or the like at the rear surface of the reflective element substrate). In FIG. 2, rear reflective element substrate 20 of reflective element assembly 14 is shown from the front side or surface 20b, so that the conductive trace 18 is shown at the rear surface 20a of reflective element substrate 20 by viewing through the transparent reflective element substrate 20.

If the mirror reflective element assembly or electrochromic cell 14 comprises a third surface reflective element assembly (where the front surface of the rear substrate, commonly referred to as the third surface of the reflective element assembly or cell, has a reflective and conductive metallic coating or layer or layers 39a (FIG. 6), such as a silver or aluminum or chromium or rhodium or other metallic materials or alloys thereof, and one or more non-metallic semi-conductive layers, such as one or more layers of indium tin oxide (ITO), indium tungsten oxide (IWO), indium cerium oxide (ICO), indium oxide (IO) or the like, disposed thereon or applied thereto), the conductive layer or epoxy 18 may be applied directly to a clean glass surface at the rear surface of the rear reflective element substrate (or may be applied to an insulating layer or the like applied directly to the clean glass surface).

Alternately, if the mirror reflective element or electrochromic cell 14 comprises a fourth surface reflective element (where the reflective coating or layer 39b (FIG. 6), such as a metallic layer or the like, is applied to the rear or fourth surface of the rear reflective element substrate of the cell), the protective paint layer or layers that are typically applied to the rear surface of the rear reflective element substrate may be replaced or covered with an insulating epoxy layer to provide an insulated surface at the rear of the rear reflective element substrate. The conductive trace 18 may then be applied to the insulating epoxy layer at the fourth surface of the reflective element assembly or cell.

The conductive epoxy layer may be applied as a conductive trace in the desired pattern onto the appropriate rear surface of the reflective element substrate. For example, the conductive epoxy may be screen printed onto the rear surface of the reflective element substrate in the desired pattern, such as shown in FIG. 2. Optionally, the conductive epoxy layer or coating may be applied over a substantial amount of the rear surface of the rear reflective element substrate and may function as an anti-shatter or anti-scatter element to limit or substantially preclude shattering/scattering of the glass reflective element substrate, such as in situations where the vehicle is involved in an accident or the like.

Optionally, the conductive trace and the mask or non-conductive layers and exposed pads or portions may be formed on the rear surface in a similar manner as it is typically formed on a conventional printed circuit board. For Example, a copper layer may be applied to the rear surface of the glass reflective element substrate and the masking or non-conductive layer may be screen printed onto the copper layer and etched away to form the desired pattern, without affecting the scope of the present invention.

After the conductive epoxy or trace has been screen printed or otherwise applied to the rear surface of the reflective element reflective element, the trace may be masked over with a non-conductive or masking layer 24 (FIGS. 3-5) that covers the conductive trace except at portions or pads 18a (FIG. 3) of conductive trace 18 for affixing circuitry and components thereto, as discussed below. The non-conductive layer 24 may substantially cover the conductive trace except in areas where components or wires or accessories or the like may be positioned to provide the desired function to the reflective element assembly or cell 14. The components or wires or accessories (shown generally at 26 in FIGS. 4 and 6) may be affixed to the appropriate portions or pads 18a that are exposed through the masking layer 24 to complete the circuitry that is integral with the mirror reflective element assembly or cell.

Also, after the conductive trace or epoxy layer has been screen printed or otherwise applied to the rear surface of the reflective element substrate, the conductive layer may be cured. It is envisioned that the conductive layer may be cured onto the rear surface of the reflective element substrate at the same time that the electrochromic reflective element assembly or cell is cured (such as at the same time that the epoxy seal 21a (FIG. 6) that is disposed around the electrochromic medium and between the substrates is cured) to cure both the conductive epoxy layer and the epoxy seal of the electrochromic cell with the same curing process. The epoxy seal and the epoxy trace or layer may be cured via an air curing process or an oven curing process or the like, without affecting the scope of the present invention.

Optionally, the non-conductive layer and electronic components or circuitry may be applied to the conductive layer and pads or portions of the conductive layer before the conductive layer has been cured. The components may thus be temporarily affixed to the conductive pads, such as via adhesive dots or drops or the like applied (and optionally robotically applied) to the pads and/or the components, and then the reflective element assembly and epoxy seal and/or circuitry may be cured to secure the circuitry and components to the conductive trace applied to the rear surface of the mirror reflective element assembly. Such an approach provides for attachment of the components and curing of the conductive layer, and optionally of the epoxy seal of the reflective element assembly as well, in a single step, thereby substantially enhancing the manufacturing processes for manufacturing the electrochromic mirror reflective element assembly or cell.

The circuitry and components, such as resistors, capacitors, jumpers, and clips and the like, and accessories, such as sensors, display elements, such as light emitting diodes (LEDs), liquid crystal display elements (LCDs), vacuum fluorescent (VF) display elements, electroluminescent (EL) display elements or video display elements or other types of display elements or displays, sensors or antennae and the like, may be applied to and secured to the appropriate exposed pads or portions of the conductive trace, such as after the trace has been masked or covered by the non-conductive layer or material. Some of the electronic components or circuitry may also be screened or applied to the conductive trace. For example, it is envisioned that carbon ink resistors may be printed onto the conductive trace with another printing pass or screening pass. The carbon ink resistors may be applied utilizing lasers to tighten the tolerances to a desired level. This approach may reduce the need for separate resistors that would otherwise have to be applied during a later step. However, other known or conventional type resistors may be attached to the appropriate pads or portions, without affecting the scope of the present invention. In situations where circuitry paths need to cross over one another (in such situations, the other side of a printed circuit board is used to make such a cross over in a conventional printed circuit board), a zero ohm jumper or resistor may be attached to spaced apart pads or portions of the conductive trace to bridge or span the gap between the pads or portions and effectively cross over a portion of a conductive trace positioned between the spaced apart pads or portions.

Although described above as being applied directly to the rear surface of the reflective element substrate and being cured thereon, it is envisioned that the conductive trace may be applied to a substantially non-stick surface and cured thereon and then peeled from the surface and applied to the rear surface of the reflective element substrate as a pre-cured flexible conductive trace. This may be preferred in some applications to minimize the waste of conductive traces in situations where some of the reflective element assemblies may be discarded or scrapped due to defects in the reflective element assemblies. The conductive trace may then be applied to a reflective element substrate of a reflective element assembly or cell after the epoxy seal has been cured and after the reflective element assembly or cell has met the quality requirements. The conductive trace may be a flexible element that may be readily applied to or adhered to the reflective element substrate surface.

It is further envisioned that the conductive trace may be initially applied to the separate surface, and the non-conductive layer or masking and the circuitry and electronic components and accessories may be applied to the conductive trace, such as in the manner as described above. The pre-cured flexible circuit sheet may then be peeled from the surface and applied to or rolled onto the rear surface of the reflective element substrate. The busbars and other accessories or components may be connected to the appropriate exposed pads or portions of the conductive trace on the flexible circuit sheet either while the flexible circuit sheet is at the separate surface or at another surface, or after the sheet has been applied to the rear surface of the reflective element substrate. The flexible circuit sheet may be adhered to or bonded to or otherwise secured to the rear surface of the reflective element substrate via any suitable means, without affecting the scope of the present invention.

As discussed above, the rearview mirror reflective element assembly of the present invention may comprise an electro-optic or electrochromic reflective element assembly or cell, such as an electrochromic mirror reflective element assembly utilizing principles disclosed in commonly assigned U.S. Pat. Nos. 6,690,268; 5,140,455; 5,151,816; 6,178,034; 6,154,306; 6,002,544; 5,567,360; 5,525,264; 5,610,756; 5,406,414; 5,253,109; 5,076,673; 5,073,012; 5,117,346; 5,724,187; 5,668,663; 5,910,854; 5,142,407; and/or 4,712,879, which are hereby incorporated herein by reference, and/or as disclosed in the following publications: N. R. Lynam, "Electrochromic Automotive Day/Night Mirrors", SAE Technical Paper Series 870636 (1987); N. R. Lynam, "Smart Windows for Automobiles", SAE Technical Paper Series 900419 (1990); N. R. Lynam and A. Agrawal, "Automotive Applications of Chromogenic Materials", Large Area Chromogenics: Materials and Devices for Transmittance Control, C. M. Lampert and C. G. Granquist, EDS., Optical Engineering Press, Wash. (1990), which are hereby incorporated by reference herein.

Figure 4:
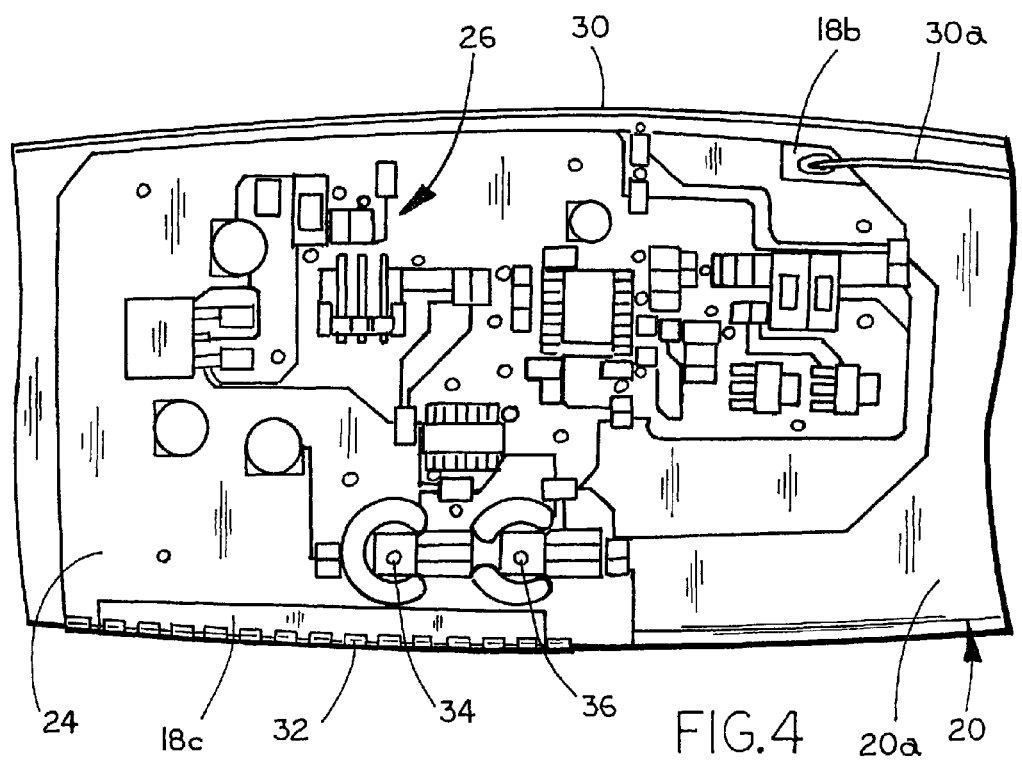
FIG. 4 is an enlarged rear elevation of the rear reflective element substrate of FIGS. 2 and 3, with components and/or circuitry attached to the conductive trace.
Figure 5:
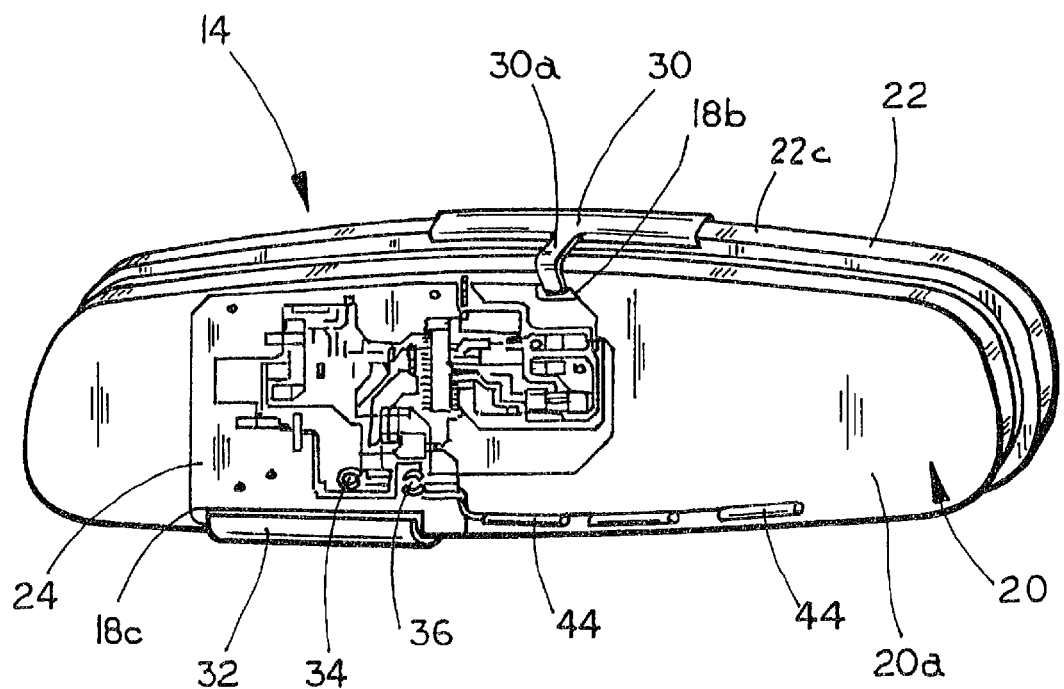
FIG. 5 is a rear perspective view of an electrochromic mirror reflective element assembly having the rear reflective element substrate of FIGS. 2-4.

As shown in FIGS. 4 and 5, mirror reflective element assembly or cell 14 may include front reflective element substrate 22 and rear reflective element substrate 20 with electrochromic medium 21 sandwiched therebetween. The front reflective element substrate 22 has a front surface 22a (the first surface of the electrochromic cell) and a rear surface 22b (the second surface of the electrochromic cell), which may include one or more transparent semi-conductive layers (such as an ITO layer or the like, or such as disclosed in PCT Application No. PCT/US03/29776, filed Sep. 19, 2003 and published Apr. 1, 2004 as International Publication No. WO 2004/026633, which is hereby incorporated herein by reference) thereon. The rear reflective element substrate 20 may include one or more transparent semi-conductive layers (such as an ITO layer or the like), and/or a metallic conductive layer (such as a layer of silver, aluminum, chromium or the like or an alloy thereof), on its front surface 20b (the third surface of the electrochromic cell), and may include multiple layers such as disclosed in PCT Application No. PCT/US03/29776, filed Sep. 19, 2003 and published Apr. 1, 2004 as International Publication No. WO 2004/026633, which is hereby incorporated herein by reference. The reflective element assembly 14 thus may comprise a third surface transflective element assembly or cell, whereby the reflective layer or surface is disposed at the third surface of the cell or at the front surface of the rear reflective element substrate for viewing by a driver of the vehicle.

Electrochromic reflective element assembly or cell 14 may include a front busbar or clip 30 that may engage or clip onto an edge portion (such as an upper edge portion 22c) of front reflective element substrate 22 to provide electrical power or current to the semiconductive layer or layers on the rear surface 22b of front reflective element substrate 22. The cell 14 may also include a rear busbar or clip 32 that may engage or clip onto an edge portion (such as a lower edge portion 20c) of rear substrate 20 to provide electrical power or current to the semiconductive or conductive layer or layers on the front surface 20b of rear substrate 20. The front clip 30 may include an extension 30a that extends rearward over the rear substrate 20 and that engages a busbar pad 18b at an upper portion of the conductive trace 18, while the rear clip 32 may engage a busbar pad 18c at a lower portion of the conductive trace 18, such that electrical power or current may be applied to front clip 30 and to rear clip 32 to darken or color the electrochromic medium 21 as desired.

The extension 30a of front clip or busbar 30 may be a separate extension attached to the clip or busbar, or may be integral with the clip or busbar, without affecting the scope of the present invention. The conductive trace 18 and exposed portions or pads 18b, 18c may extend to the upper and lower edges of the reflective element substrate and may act as a conductive rail along the edges so the clips 30, 32 may contact the conductive trace directly, with no wiring being necessary to connect the clips or busbars to the circuitry. The present invention thus may avoid the need to solder leads onto the busbars as is typically required with conventional busbars, such that the electrochromic mirror reflective element assembly of the present invention may provide for enhanced manufacturing processing. Optionally, an ASIC (application specific integrated circuit) die with external capacitors and clips may be applied at or near the upper and lower edges of the rear reflective element substrate for connection to the electrochromic clips or busbars 30, 32. Optionally, and as shown in FIG. 4, the extension 30a may comprise a wire or lead that is soldered or otherwise conductively connected or secured to the busbar pad 18b to connect an end or portion of the clip or busbar 30 to the busbar pad 18b, without affecting the scope of the present invention. The clips or busbars and substrates and coatings may be configured and may function similar to known busbars and substrates and coatings, or may be of the types described in PCT Application No. PCT/US03/35381, filed Nov. 5, 2003 and published on May 21, 2004 as International Publication No. WO 2004/042457, which is hereby incorporated herein by reference.

Figure 6:
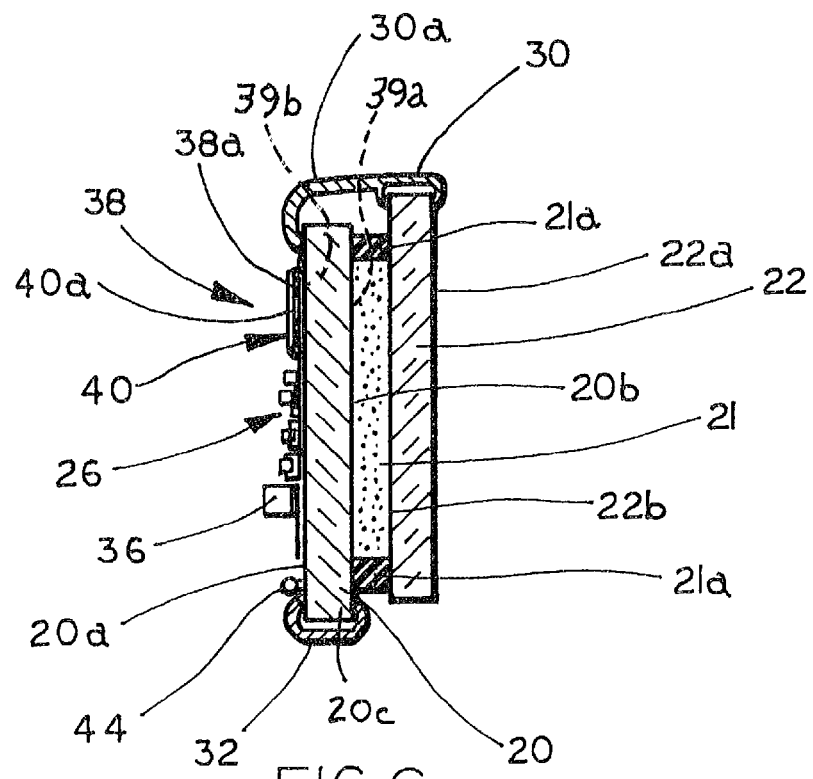
FIG. 6 is a sectional view of the electrochromic mirror reflective element assembly of FIG. 5.

The conductive trace 18 and electronic components and/or circuitry 26 may comprise or mount or attach one or more accessories, such as lights, a microphone, user actuatable controls or inputs, sensors, such as photo sensors or the like, or any other type of accessory suitable for such an application, as discussed below. For example, and as shown in FIGS. 4-6, one or more light sensors or photo diodes 34, 36 may be attached or mounted to appropriate exposed pads or portions 18d (FIG. 3) of conductive trace 18, and may be operable to sense light at the mirror assembly. More particularly, light sensor 34 may be a forwardly facing (with respect to the direction of travel of the vehicle) sensor operable to detect the ambient light at the mirror assembly (such as via detecting light through an opening in the mirror casing or the like that receives light from forward of the mirror assembly and in the direction of travel of the vehicle), while light sensor 36 may be operable to detect glare at the mirror reflective element (such as by detecting light from rearward of the mirror assembly and from rearward of the vehicle). In order for light sensor 36 to detect the glare light rearward of the mirror assembly, it is envisioned that a window or transparent portion or area may be formed in the reflective layer or coating of the reflective element substrates to allow the sensor to view or receive light from rearwardly of the mirror assembly. Alternately, the light sensor may receive light that passes through the electro-optic reflective element assembly or cell, such as in display on demand or transflective cells and the like, without affecting the scope of the present invention.

Optionally, and with reference to FIG. 7, a light pipe 37 may be implemented to direct light though the bezel or casing of the mirror assembly and to bend the light, such as approximately 90 degrees or approximately 180 degrees (depending on the mounting orientation of the sensor) to direct or deliver the light to the sensor 36 at the circuitry on the back of the rear or second reflective element substrate, without affecting the scope of the present invention. In the illustrated embodiment of FIG. 7, the light pipe 37 functions to bend the light about 180 degrees to direct light from rearward of the mirror assembly (such as light at the bezel portion 13' of the mirror assembly 10') to the forward facing light sensor or photo sensor 36 at the conductive trace and circuitry 26 at the rear or fourth surface of the reflective element assembly. Optionally, the light pipe may extend between the circuitry and the back of an electrochromic reflective element assembly or cell where the light will be sensed/gathered/received from light passing through the cell, without affecting the scope of the present invention. Such an application may be suitable for use in applications with a transflective or display on demand type of cell. The sensors thus may face in generally the same direction on the circuitry, but may utilize light gathering means, such as one or more light pipes or the like, to gather and/or receive light from different directions, and may utilize aspects of the sensors described in U.S. patent application Ser. No. 10/229,573, filed Aug. 28, 2002, published Mar. 6, 2003 as U.S. Publication No. 2003-0043589, now U.S. Pat. No. 7,008,090, which is hereby incorporated herein by reference.

Although shown and described as comprising an electrochromic reflective element assembly, the present invention is equally applicable to prismatic reflective element assemblies and the like. For example, a conductive trace may be applied to a rear surface of a prismatic or wedge-shaped reflective element substrate, and electronic components and/or circuitry may be applied to the conductive trace, such as in a similar manner as described above, without affecting the scope of the present invention. The prismatic mirror assembly may comprise any type of prismatic mirror assembly, such as prismatic mirror assembly utilizing aspects described in U.S.

Pat. Nos. 6,318,870; 5,327,288; 4,948,242; 4,826,289; 4,436,371; and 4,435,042; and PCT Application No. PCT/US04/015424, filed May 18, 2004 and published on Dec. 2, 2004, as International Publication No. WO 2004/103772; and U.S. patent application Ser. No. 10/933,842, filed Sep. 3, 2004, now U.S. Pat. No. 7,249,860, which are hereby incorporated herein by reference. Optionally, the prismatic reflective element may comprise a conventional prismatic reflective element or prism or may comprise a prismatic reflective element of the types described in PCT Application No. PCT/US03/29776, filed Sep. 19, 2003 and published Apr. 1, 2004 as International Publication No. WO 2004/026633; U.S. patent application Ser. No. 10/709,434, filed May 5, 2004, now U.S. Pat. No. 7,420,756; and U.S. provisional application Ser. No. 60/525,952, filed Nov. 26, 2003 by Lynam for MIRROR REFLECTIVE ELEMENT FOR A VEHICLE, which are all hereby incorporated herein by reference, without affecting the scope of the present invention. A variety of mirror accessories and constructions are known in the art, such as those disclosed in U.S. Pat. Nos. 5,555,136; 5,582,383; 5,680,263; 6,227,675; 6,229,319; and 6,315,421 (the entire disclosures of which are hereby incorporated by reference herein), that can utilize aspects of the present invention.

Optionally, the mirror reflective element assembly or cell 14 and electronic components and/or circuitry applied to the rear surface of the rear reflective element substrate may include display elements, such as for a display on demand type of display, such as of the types disclosed in commonly assigned U.S. Pat. Nos. 6,690,268; 5,668,663 and 5,724,187, and/or in U.S. patent application Ser. No. 10/054,633, filed Jan. 22, 2002, now U.S. Pat. No. 7,195,381, and/or in PCT Application No. PCT/US03/29776, filed Sep. 9, 2003 and published Apr. 1, 2004 as International Publication No. WO 2004/026633; and/or PCT Application No. PCT/US03/40611, filed Dec. 19, 2003 and published on Jul. 15, 2004 as International Publication No. WO 2004/058540, which are all hereby incorporated herein by reference.

With such a display, it is not only desirable to adjust the display brightness according to ambient lighting conditions, but it is also desirable to adjust the display brightness such that a sufficient contrast ratio is maintained against the variable background brightness of the reflected scene. Also, it may be desirable to compensate for changes in transmission of the electrochromic device to control rearward glare sources, so that the display brightness appears to be maintained at a generally constant level. The display and/or transmissivity of the electro-optic device may be adjusted to provide the desired function or viewability, such as by utilizing aspects of the systems described in U.S. patent application Ser. No. 10/427,026, filed Apr. 30, 2003, now U.S. Pat. No. 6,918,674, which is hereby incorporated herein by reference. Optionally, the circuitry 26 may include a light emitting diode (LED) array module or the like bonded or placed on or at or connected to the appropriate portions or pads of the conductive trace applied to the rear surface of the rear reflective element substrate and operable to emit light or display information through the mirror cell for viewing through the reflective element substrate or substrates by the driver or occupant of the vehicle. Other types of display elements may be implemented without affecting the scope of the present invention.

Optionally, and as shown in FIG. 6, the electrochromic mirror cell 14 may incorporate an integrated display element, such as a liquid crystal display (LCD) element 38, on or at the rear surface 20a of rear reflective element substrate 20. Typically, a liquid crystal display element may include two sheets of spaced apart glass sheets with an appropriate conductive pattern printed on one of the surfaces of one of the sheets. The present invention may incorporate such a display on the rear surface of the rear reflective element substrate by applying a clear conductive pattern 38a (such as an ITO or the like) on the rear surface of the rear reflective element substrate, and such as at a window formed in the silvering or reflective layer of the mirror reflective element assembly or cell. The conductive pattern may be connected directly to the conductive trace applied to the rear surface of the reflective element substrate. An outer LCD glass sheet 40 may be provided with a continuous conductive coating (such as an ITO or the like) on its rear surface 40a and may be placed at the conductive pattern 38a and spaced therefrom, such as via glass spacer beads or the like. The glass sheet 40 may include a jumper lead to connect to an appropriate trace or pad at the rear surface 20a of rear substrate 20, or a connecting bump or pad may be formed in the trace to span the gap between the glass sheet 40 and the rear surface of the rear reflective element substrate and to connect the conductive trace to the continuous conductive coating on the glass sheet 40, without affecting the scope of the present invention. The mirror reflective element assembly or cell of the present invention thus may integrate an LCD display onto the reflective element or glass substrate of the reflective element assembly by using the reflective element or glass substrate of the mirror cell as the front glass sheet of the LCD display element.

Optionally, the printed circuit board of the mirror assembly of the present invention may include a display element along or partially along an edge of the board and may include one or more user-actuatable controls or buttons near or adjacent to the display element. The display element may be any type of display element, such as a vacuum fluorescent (YF) display element, a light emitting diode (LED) display element, an electroluminescent (EL) display element, a liquid crystal display (LCD) element, a video screen display element or the like, and may be operable to display various information (as discrete characters, icons or the like, or in a multi-pixel manner) to the driver of the vehicle, such as passenger side inflatable restraint (PSIR) information, tire pressure status, and/or the like. The buttons may be for actuating or controlling various accessories or controls or components associated with the vehicle, such as for a compass calibration setting or zone setting, a telematics actuation, a garage door opener, an electronic toll control (such as disclosed in U.S. Pat. No. 6,690,268, which is hereby incorporated herein by reference), and/or the like, or may be for switching the display between various functions or modes, without affecting the scope of the present invention.

Optionally, and as can be seen with reference to FIG. 1, electrochromic mirror reflective element assembly or cell 14 may include or may be associated with one or more switchable accessories, which may be toggled via actuation of one or more switches or buttons or inputs 42 at the front of the mirror assembly 10, such as along the bezel 13 of the mirror assembly 10. The user inputs or buttons may be for actuating or controlling various accessories or controls or components associated with the vehicle, such as for a compass calibration setting or zone setting, a telematics actuation, a garage door opener, an electronic toll control (such as disclosed in U.S. Pat. No. 6,690,268, which is hereby incorporated herein by reference), and/or the like, or may be for switching the display between various functions or modes, without affecting the scope of the present invention. Optionally, the user inputs may comprise touch sensors or proximity sensing inputs or the like, such as sensors of the types described in U.S. Pat. Nos. 6,001,486; 6,310,611; 6,320,282; 6,627,918; and 5,594,222; and/or U.S. Pat. Publication No. 2002/0044065, published Apr. 18, 2002, now U.S. Pat. No. 7,224,324; and/or U.S. patent application Ser. No. 10/933,842, filed Sep. 3, 2004, now U.S. Pat. No. 7,249,860; and/or PCT Application No. PCT/US03/40611, filed Dec. 19, 2003 and published on Jul. 15, 2004 as International Publication No. WO 2004/058540, which are hereby incorporated herein by reference, or may comprise inputs molded within the bezel of the mirror assembly, such as described in U.S. provisional applications Ser. No. 60/535,559, filed Jan. 9, 2004 by Lindahl for MIRROR ASSEMBLY; and/or Ser. No. 60/553,517, filed Mar. 16, 2004 by Lindahl et al. for MIRROR ASSEMBLY, which are hereby incorporated herein by reference, or may comprise membrane type switches, such as described in U.S. provisional application Ser. No. 60/575,904, filed Jun. 1, 2004 by Uken for MIRROR ASSEMBLY FOR VEHICLE, which is hereby incorporated herein by reference; and/or the like, without affecting the scope of the present invention.

It is envisioned that the inputs 42 may be formed in the bezel 13 and that the circuitry applied to or disposed at the rear surface of the rear reflective element substrate may include one or more proximity sensors or sensing elements or antennae 44 (FIGS. 5 and 6) positioned along a lower edge of the rear surface of the rear reflective element substrate and generally corresponding with a respective one of the inputs 42. For example, the antenna or antennae or sensing elements may be adhered or clipped or otherwise secured to appropriate exposed pads or portions of the conductive trace 18 to position the antenna or antennae at the desired or appropriate location at the rear of the reflective element substrate. The antenna or antennae or sensing elements 44 may detect the presence of a person's finger at or near the respective input or inputs 42 and may actuate or control a display element or the like or may actuate or control or trigger the circuitry to switch or toggle the device associated with the input 42 in response to such a detection.

As shown in FIG. 5, the sensing elements 44 may be disposed along the lower or bottom edge of the rear reflective element substrate and may monitor a respective zone around the lower edge of the reflective element substrate or glass substrate. The sensing element or elements may provide a three dimensional cylinder of detection that extends along the bottom edge of the reflective element substrate and that encompasses the respective icon or input 42 at the bezel. As also shown in FIG. 5, the sensing element may comprise multiple separate sensing elements or antennae or antenna segments that may monitor separate zones corresponding to the respective inputs 42 at the bezel. The inputs 42 at the bezel thus may comprise a screen printed icon or character or the like at the bezel, and may not comprise any movable buttons or inputs or the like. As the user's finger approaches the desired input 42 (or spot or icon on the bezel), the corresponding antenna segment may detect the presence of the finger prior to contact as the finger enters the zone or cylinder of detection for that antenna segment. The electronic components and/or circuitry associated with that particular antenna may then toggle the device or accessory associated with the input, such as between an on/off status, a temperature or compass selection (such as for a temperature/compass display), a degrees F./degrees C. selection (such as for a temperature display), and/or the like.

Optionally, the controls may be operable to activate/deactivate/toggle/control an accessory in response to a detection of a user's finger or the like approaching the input or button region or sensing element at the mirror assembly. Because such inputs may be individual or separate proximity sensors or antennae positioned within the mirror assembly and not readily viewable or discernable by the driver or occupant of the vehicle, the mirror assembly may include a display or indicator that indicates the function of each input. Preferably, the mirror assembly may include a control or circuitry that selectively or occasionally activates a display to temporarily display the feature or function or accessory associated with the particular input or input region of the mirror assembly, such as in response to the user's finger or the like approaching the input area or the like. For example, it is further envisioned that when a user's finger is first detected as it approaches the input region (such as when the user's finger or the like is within a first threshold distance from one of the sensors, such as within about ¼ or ½ of an inch or thereabouts), the control or circuitry may activate a display (such as a display on demand type of display or transflective display that is viewable through the reflective element of the mirror assembly, such as described in U.S. Pat. Nos. 6,690,268; 5,668,663 and/or 5,724,187, and/or in U.S. patent application Ser. No. 10/054,633, filed Jan. 22, 2002, now U.S. Pat. No. 7,195,381, and/or Ser. No. 10/933,842, filed Sep. 3, 2004, now U.S. Pat. No. 7,249,860; and/or PCT Application No. PCT/US03/29776, filed Sep. 9, 2003 and published Apr. 1, 2004 as International Publication No. WO 2004/026633; and/or PCT Application No. PCT/US03/40611, filed Dec. 19, 2003 and published on Jul. 15, 2004 as International Publication No. WO 2004/058540, which are all hereby incorporated herein by reference) that indicates the accessory or feature or function associated with at least some or all of the inputs along the bezel or other region of the mirror assembly. The display may list or indicate the features (such as via text or icons or other indicia) at areas of the reflective element that are near to or generally adjacent to the respective inputs or input regions.

When the user then moves his or her finger to touch or contact the desired or appropriate input (or may move the finger closer to the input region or sensor, such as within a second threshold distance from the sensor that is smaller than the first threshold distance), such as at the bezel or the like, the detection of the contact (or of a closer proximity of the finger) may cause the control to activate/deactivate or toggle/adjust or control the accessory or feature or function associated with that input or input region. As the user's finger is moved closer to or contacts the selected input region, the displays for the other inputs may deactivate so that only the display for the selected input remains viewable by the user. Optionally, the detection of the closer proximity (such as within the second threshold distance or touching) may cause other menus or the like to appear at the mirror assembly, whereby the user may toggle or scroll through the menus to accomplish the desired task or activate/deactivate/adjust the desired or appropriate accessory or function or feature. The user thus may activate/deactivate/toggle/adjust/control the accessory or function or feature associated with the selected input or may scroll through a menu shown in the display at the reflective element.

Optionally, it is envisioned that the control or circuitry may initially activate a display element or display device associated with one of the inputs or buttons or sensor regions, such that as the user's finger approaches a particular input or button or sensor region (such as when the user's finger is within a threshold distance of the input, such as within approximately ¼ or ½ inches or thereabouts of the input or input region), the control or circuitry may activate the respective display that indicates the accessory or feature or function associated with that particular input or input region or sensor. The user thus may move their finger along the front of the mirror assembly (and over and along the separate/distinct sensors or input regions) and view the display or information for the accessory or feature or function associated with each region or input. When the user's finger is located at the desired function, the user may then contact the input region (or may move the finger closer to the input region or sensor), whereby the detection of the contact (or of a closer proximity of the finger) may cause the control to activate/deactivate or toggle/adjust or control the accessory or feature or function associated with that input or input region, or may cause other menus or the like to appear at the mirror assembly, such as described above.

The present invention thus provides for the circuitry and electronic components to be kept substantially or entirely at the rear of the mirror reflective element assembly or cell, yet provides for front switching of an accessory or the like. The present invention provides for such front switching in response to a touch or approach of a designated area at the bezel (or elsewhere around the mirror assembly), without any buttons and associated wires or leads being needed at the bezel area. Also, because the proximity sensors or antennae or antenna segments are positioned at the rear of the reflective element or cell, no soldering or otherwise connecting of leads or wires to the buttons at the front of the mirror assembly is required. The present invention thus provides for such functions with a bezel that provides a reduced cost and complexity of the bezel and the casing of the mirror assembly.

The electronic components or circuitry and/or accessories may receive power from the vehicle power source, whereby the vehicle may include wiring to the mirror assembly, such as two wires for power and ground to the mirror assembly. Optionally, the vehicle may incorporate a telematics system, such as an ONSTAR® system or the like, which may have circuitry in the instrument panel of the vehicle. The telematics circuitry may include wires connected to the buttons or inputs at the mirror assembly that provide a toggling function to the telematics system in response to actuation of the respective telematics inputs. It is envisioned that the same wiring to the mirror assembly may also be selectably usable to provide for signal transmission from the telematics system to the mirror assembly, such as for a global positioning system (GPS) function or the like.

Optionally, the power and ground connection may only be provided to the mounting bracket, which may provide an electrical contact to the mirror circuitry via an electrical contact or wiper action at the ball and socket connection of the mounting arm or mounting arrangement of the mirror assembly. For example, the signals may be provided via a mounting arrangement utilizing aspects of the mounting arrangements described in U.S. patent application Ser. No. 10/032,401, filed Dec. 20, 2001, now U.S. Pat. Publication No. US2002/0088916A1, published Jul. 11, 2002, now U.S. Pat. No. 6,877,709; and/or PCT Application No. PCT/US2004/015424, filed May 18, 2004 and published on Dec. 2, 2004, as International Publication No. WO 2004/103772, and/or U.S. provisional application Ser. No. 60/609,642, filed Sep. 14, 2004 by Kamer for MOUNTING ASSEMBLY FOR MIRROR AND METHOD OF MAKING SAME, which are hereby incorporated herein by reference, or may utilize electrical connection principles of the type described in International Publication No. WO 2003/095269 A3, published Nov. 20, 2003 for REARVIEW MIRROR ASSEMBLIES, which is hereby incorporated herein by reference. The signals to control the accessories or circuitry of the mirror assembly may optionally be provided through an infrared link between the mounting bracket and the circuitry in the mirror, such as described in U.S. patent application Ser. No. 10/456,599, filed Jun. 6, 2003, now U.S. Pat. No. 7,004,593, which is hereby incorporated herein by reference.

Optionally, the conductive trace and electronic components or circuitry at the reflective element substrate of the mirror assembly may provide or include or be associated with other accessories, such as a rain sensor (such as the type disclosed in commonly assigned U.S. Pat. Nos. 6,320,176; 6,353,392 and 6,313,454, which are hereby incorporated herein by reference), an image sensor (such as a video camera, such as a CMOS imaging array sensor, a CCD sensor or the like, such as the types disclosed in commonly assigned, U.S. Pat. Nos. 5,550,677; 6,097,023 and 5,796,094, which are hereby incorporated herein by reference), a temperature sensor (such as a contact temperature sensor for measuring the temperature at or of the windshield), an antenna, a compass (such as the types disclosed in U.S. patent application Ser. No. 10/456,599, filed Jun. 6, 2003, now U.S. Pat. No. 7,004,593, which is hereby incorporated herein by reference) or any other sensor or accessory or device. For example, the mirror assembly may include a forward facing video image sensor or system, which may include an intelligent rain sensor (such as the type disclosed in commonly assigned U.S. Pat. Nos. 6,320,176; 6,353,392 and 6,313,454, which are hereby incorporated herein by reference), an image or vision system (including an imaging sensor, such as a video camera, such as a CMOS imaging array sensor, a CCD sensor or the like, such as the types disclosed in commonly assigned, U.S. Pat. Nos. 5,550,677; 6,097,023 and 5,796,094, and U.S. patent application Ser. No. 10/422,378, filed Apr. 24, 2003, now U.S. Pat. No. 6,946,978, which are hereby incorporated herein by reference), an intelligent headlamp controller (such as the type disclosed in U.S. Pat. No. 5,796,094 and/or in U.S. patent application Ser. No. 10/355,454, filed Jan. 31, 2003, now U.S. Pat. No. 6,824,281, which are hereby incorporated herein by reference), an intelligent lane departure warning system, such as the type disclosed in U.S. patent application Ser. No. 10/427,051, filed Apr. 30, 2003, now U.S. Pat. No. 7,038,577, which is hereby incorporated herein by reference, and/or the like. Optionally, the mirror assembly of the present invention may include one or more displays, such as a text display, an iconistic display, a display on demand type display (such as may be implemented with a transflective reflective element, such as described in U.S. Pat. Nos. 6,690,268; 5,668,663 and 5,724,187, which are hereby incorporated by reference herein), a video or touch screen interface display, or the like, and/or one or more sensors or other accessories, such as a biometric imager, such as for fingerprint authentication or the like, an infrared sensor, such as a zonal temperature sensor, such as suitable for an auto climate control, a forward facing image sensor, such as described above, a rearward facing image sensor (such as for biometric imaging (such as for face recognition, iris recognition or the like), seat height or position detection, drowsiness detection, safety/restraints, object detection and position, emergency response image capture system, intrusion detection or the like), and/or an electronic field sensor (such as the type disclosed in commonly assigned U.S. Pat. No. 6,768,420, which is hereby incorporated herein by reference) and/or the like. The display and/or accessories may be associated with a communication system, a speaker, a telematics module (which may include a GPS module, a wireless communication module, an human/machine interface (HMI), a display, such as an LED display, a dot matrix display, an alpha numeric display, a video display or the like, and/or a microphone, which may be operable for speech or voice recognition, noise reduction or noise cancellation), a humidity sensor, a remote keyless entry sensor, a tire pressure monitoring system (TPMS) (such as the types described in U.S. Pat. Nos. 6,731,205; 6,294,989; 6,124,647; 6,445,287; and/or 6,472,979, and/or U.S. provisional application Ser. No. 60/611,796, filed Sep. 21, 2004 by O'Brien for TIRE PRESSURE ALERT SYSTEM, which are hereby incorporated herein by reference), an electronic toll collection sensor, an intelligent headlamp control, user interface controls (such as buttons, switches or the like for controlling various accessories of the vehicle, such as a sunroof, a communication system, lamps, security systems, displays or the like) or any other accessories, sensors, lights, indicators, displays or the like which may be suitable for mounting or positioning at or within the rearview mirror assembly.

The accessories or components of the rearview mirror assembly may be connected to the vehicle electronic or communication systems and may be connected via various protocols or nodes, such as Bluetooth, SCP, UBP, J1850, CAN J2284, Fire Wire 1394, MOST, LIN and/or the like, depending on the particular application of the rearview mirror assembly of the present invention. The rearview mirror assembly may be electronically integrated with the vehicle electrical and/or control systems. For example, the rearview mirror assembly may connect to a sunroof control, rain sensor control, mass motion sensor, roof lighting control, microphone/cell phone control, climate control, and/or the like.

Therefore, the rearview mirror assembly and mirror reflective element assembly of the present invention provides a mirror reflective element assembly that includes the conductive trace and electronic components or circuitry applied directly to or integrated with the rear surface of the reflective element substrate of the mirror reflective element assembly or cell. The present invention thus provides a circuitry on glass arrangement and thus obviates the need for a separate rigid board or substrate for receiving circuitry thereon, and also obviates the need for an attachment plate and associated connectors for attaching such a printed circuit board to the rear of the reflective element assembly or cell. The present invention thus provides a compact and lightweight mirror reflective element assembly that provides enhanced assembly processing and minimizes electrical wiring and connections that may have to be made to connect the circuitry to various components or accessories associated with the mirror reflective element assembly.

Changes and modifications in the specifically described embodiments may be carried out without departing from the principles of the present invention, which is intended to be limited only by the scope of the appended claims as interpreted according to the principles of patent law.

The invention claimed is:

1. An electrochromic interior reflective element for an interior rearview mirror assembly of a vehicle, said electrochromic interior reflective element comprising:
    a front substrate having a first glass surface and a second glass surface;
    a rear substrate having a third glass surface and a fourth glass surface;
    an electrochromic medium sandwiched between said front and rear substrates, wherein said electrochromic medium is disposed in an interpane cavity established between said third glass surface of said rear substrate and said second glass surface of said front substrate, and wherein said electrochromic medium is bounded by a perimeter seal;
    wherein said electrochromic interior reflective element comprises a transparent electrically conductive coating disposed at said second glass surface of said front substrate and a mirror reflector disposed at said third glass surface of said rear substrate, wherein said mirror reflector comprises at least one metallic thin film;
    a conductive layer applied directly at said fourth glass surface of said rear substrate;
    a non-conductive layer covering a covered portion of said conductive layer and leaving an exposed portion of said conductive layer exposed;
    an electronic circuitry component disposed at said fourth glass surface of said rear substrate; and
    wherein said electronic circuitry component is electrically connected to said exposed portion of said conductive layer.

2. The electrochromic interior reflective element of claim 1, wherein said conductive layer includes exposed busbar portions, and wherein said transparent conductive coating of said front substrate is electrically connected with one of said exposed busbar portions, and wherein said minor reflector of said rear substrate is electrically connected with another of said exposed busbar portions.

3. The electrochromic interior reflective element of claim 1, wherein said electronic circuitry component comprises a component selected from the group consisting of a sensor, a resistor, a capacitor and a display element.

4. The electrochromic interior reflective element of claim 1, wherein said electronic circuitry component comprises a carbon ink resistor printed onto said exposed portion of said conductive layer at said fourth glass surface of said rear substrate.

5. The electrochromic interior reflective element of claim 1, wherein said electronic circuitry component comprises a display element integrally formed on said rear substrate.

6. The electrochromic interior reflective element of claim 5, wherein said display element comprises a liquid crystal display element.

7. The electrochromic interior reflective element of claim 1, wherein said conductive layer limits shattering of said rear substrate.

8. The electrochromic interior reflective element of claim 1, wherein said electronic circuitry component comprises a proximity sensor disposed at said fourth glass surface of said rear substrate, and wherein said proximity sensor is operable to detect a presence of a person's finger at or near said electrochromic interior reflective element.

9. The electrochromic interior reflective element of claim 8, wherein said proximity sensor is operable to detect the presence of the person's finger at or near an icon.

10. The electrochromic interior reflective element of claim 8, wherein said electronic circuitry component is operable to control a display element in response to said detection of the person's finger.

11. The electrochromic interior reflective element of claim 8, wherein said electronic circuitry component is operable to toggle an accessory in response to said detection of the person's finger.

12. The electrochromic interior reflective element of claim 1, wherein said non-conductive layer leaves a plurality of exposed portions of said conductive layer exposed, and wherein a plurality of electronic circuitry components are disposed at said fourth glass surface of said rear substrate, and wherein said electronic circuitry components are electrically connected to respective exposed portions of said conductive layer.

13. An electrochromic interior reflective element for an interior rearview minor assembly of a vehicle, said electrochromic interior reflective element comprising:
    a front glass substrate having a first glass surface and a second glass surface;
    a rear glass substrate having a third glass surface and a fourth glass surface;
    an electrochromic medium sandwiched between said front and rear glass substrates, wherein said electrochromic medium is disposed in an interpane cavity established between said third glass surface of said rear glass substrate and said second glass surface of said front glass substrate, and wherein said electrochromic medium is bounded by a perimeter seal;

wherein said electrochromic interior reflective element comprises a transparent electrically conductive coating disposed at said second glass surface of said front glass substrate and a minor reflector disposed at said third glass surface of said rear glass substrate, wherein said minor reflector comprises at least one metallic thin film;

a conductive layer applied directly at said fourth glass surface of said rear glass substrate;

a non-conductive layer covering a covered portion of said conductive layer and leaving an exposed portion of said conductive layer exposed;

an electronic circuitry component disposed at said fourth glass surface of said rear glass substrate, wherein said electronic circuitry component comprises a component selected from the group consisting of a sensor, a resistor, a capacitor and a display element; and wherein said electronic circuitry component is electrically connected to said exposed portion of said conductive layer.

14. The electrochromic interior reflective element of claim 13, wherein said electronic circuitry component comprises a proximity sensor disposed at said fourth glass surface of said rear glass substrate, and wherein said proximity sensor is operable to detect a presence of a person's finger at or near said electrochromic interior reflective element.

15. The electrochromic interior reflective element of claim 14, wherein said proximity sensor is operable to detect the presence of the person's finger at or near an icon.

16. The electrochromic interior reflective element of claim 14, wherein said electronic circuitry component is operable to control a display element in response to said detection of the person's finger.

17. The electrochromic interior reflective element of claim 14, wherein said electronic circuitry component is operable to toggle an accessory in response to said detection of the person's finger.

18. The electrochromic interior reflective element of claim 13, wherein said non-conductive layer leaves a plurality of exposed portions of said conductive layer exposed, and wherein a plurality of electronic circuitry components are disposed at said fourth glass surface of said rear glass substrate, and wherein said electronic circuitry components are electrically connected to respective exposed portions of said conductive layer.

19. An electrochromic interior reflective element for an interior rearview mirror assembly of a vehicle, said electrochromic interior reflective element comprising:

a front glass substrate having a first glass surface and a second glass surface;

a rear glass substrate having a third glass surface and a fourth glass surface;

an electrochromic medium sandwiched between said front and rear glass substrates, wherein said electrochromic medium is disposed in an interpane cavity established between said third glass surface of said rear glass substrate and said second glass surface of said front glass substrate, and wherein said electrochromic medium is bounded by a perimeter seal;

wherein said electrochromic interior reflective element comprises a transparent electrically conductive coating disposed at said second glass surface of said front glass substrate and a mirror reflector disposed at said third glass surface of said rear glass substrate, wherein said mirror reflector comprises at least one metallic thin film;

a conductive layer applied directly at said fourth glass surface of said rear glass substrate;

a non-conductive layer covering a covered portion of said conductive layer and leaving an exposed portion of said conductive layer exposed;

an electronic circuitry component disposed at said fourth glass surface of said rear glass substrate;

wherein said electronic circuitry component is electrically connected to said exposed portion of said conductive layer;

wherein said electronic circuitry component comprises a proximity sensor disposed at said fourth glass surface of said rear glass substrate, and wherein said proximity sensor is operable to detect a presence of a person's finger at or near said electrochromic interior reflective element; and wherein said proximity sensor is operable to detect the presence of the person's finger at or near an icon.

20. The electrochromic interior reflective element of claim 19, wherein said electronic circuitry component is operable to control a display element in response to said detection of the person's finger.

21. The electrochromic interior reflective element of claim 19, wherein said electronic circuitry component is operable to toggle an accessory in response to said detection of the person's finger.

22. The electrochromic interior reflective element of claim 19, wherein said non-conductive layer leaves a plurality of exposed portions of said conductive layer exposed, and wherein a plurality of electronic circuitry components are disposed at said fourth glass surface of said rear glass substrate, and wherein said electronic circuitry components are electrically connected to respective exposed portions of said conductive layer.

* * * * *

UNITED STATES PATENT AND TRADEMARK OFFICE
CERTIFICATE OF CORRECTION

| | | |
|---|---|---|
| PATENT NO. | : 8,379,289 B2 | Page 1 of 1 |
| APPLICATION NO. | : 13/470864 | |
| DATED | : February 19, 2013 | |
| INVENTOR(S) | : Kenneth Schofield, David C. Wight and Mark E. Kramer | |

It is certified that error appears in the above-identified patent and that said Letters Patent is hereby corrected as shown below:

In the Specification

Column 10
Line 30, "though" should be -- through --

Column 12
Line 31, "(YF)" should be -- (VF) --

Column 15
Line 6, "minor" should be -- mirror --
Line 51, "Kamer" should be -- Karner --

In the Claims

Column 18
Line 10, Claim 1, "minor" should be -- mirror --

Column 18
Line 57, Claim 13, "minor" should be -- mirror --

Column 19
Line 6, Claim 13, "minor" should be -- mirror --
Line 8, Claim 13, "minor" should be -- mirror --

Signed and Sealed this
Eleventh Day of March, 2014

Michelle K. Lee
*Deputy Director of the United States Patent and Trademark Office*